(12) United States Patent
Nishimura et al.

(10) Patent No.: US 10,910,361 B2
(45) Date of Patent: Feb. 2, 2021

(54) SEMICONDUCTOR ELEMENT AND SEMICONDUCTOR DEVICE

(71) Applicant: FUJI ELECTRIC CO., LTD., Kawasaki (JP)

(72) Inventors: Takeyoshi Nishimura, Matsumoto (JP); Isamu Sugai, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 16/521,060

(22) Filed: Jul. 24, 2019

(65) Prior Publication Data
US 2020/0091135 A1 Mar. 19, 2020

(30) Foreign Application Priority Data
Sep. 14, 2018 (JP) .................................. 2018-173085

(51) Int. Cl.
*H01L 29/66* (2006.01)
*H01L 27/02* (2006.01)

(52) U.S. Cl.
CPC .............................. *H01L 27/0255* (2013.01)

(58) Field of Classification Search
CPC ... H01L 27/0255; E21B 43/24; E21B 43/243; E21B 43/2401; E21B 43/30; E21B 36/04
See application file for complete search history.

(56) References Cited

U.S. PATENT DOCUMENTS

| 10,277,219 B2 | 4/2019 | Sander et al. |
| 2001/0009287 A1* | 7/2001 | Fujihira ............... H01L 29/7808 257/328 |

(Continued)

FOREIGN PATENT DOCUMENTS

| JP | 4178831 B2 | 11/2008 |
| JP | 2009-88006 A | 4/2009 |

(Continued)

OTHER PUBLICATIONS

Tsukasa Suzuki et al., "Development of RBPMOS (MOS FET with Reverse Connection Battery Protection) for Automotive Application", Sanken Technical Report, vol. 42, 2010. (pp. 15-18).

*Primary Examiner* — Victor A Mandala
*Assistant Examiner* — Colleen E Snow

(57) ABSTRACT

Provided are a semiconductor element and a semiconductor device capable of reducing possibilities of malfunctions and breakdowns due to temperature rise. A semiconductor element (50) includes a first MOS transistor (Tr1), a second MOS transistor (Tr2), and a temperature detecting element (TD) that are provided on a semiconductor substrate (SB). The first MOS transistor (Tr1) includes an n-type source region (8), an n-type first semiconductor region (21) arranged away from the source region (8) and a p-type well region (31) arranged between the source region (8) and the first semiconductor region (21). The second MOS transistor (Tr2) includes an n-type source region (8) an n-type second semiconductor region (22) arranged away from the source region (8), and a p-type well region (31) arranged between the source region (8) and the second semiconductor region (22). The first semiconductor region (21) is connected to the second semiconductor region (22).

18 Claims, 25 Drawing Sheets

(56) References Cited

U.S. PATENT DOCUMENTS

| | | | |
|---|---|---|---|
| 2005/0156267 A1* | 7/2005 | Mori | ............... H01L 29/7804 |
| | | | 257/467 |
| 2014/0070319 A1 | 3/2014 | Tonomura et al. | |
| 2016/0020276 A1 | 1/2016 | Lu | |
| 2017/0047321 A1* | 2/2017 | Nishimura | ......... H01L 27/0727 |
| 2018/0183427 A1 | 6/2018 | Nakajima et al. | |

FOREIGN PATENT DOCUMENTS

| | | |
|---|---|---|
| JP | 2016-21539 A | 2/2016 |
| JP | 5990437 B2 | 9/2016 |
| JP | 2018-107331 A | 7/2018 |

* cited by examiner

SEMICONDUCTOR ELEMENT AND SEMICONDUCTOR DEVICE

CROSS-REFERENCE TO RELATED APPLICATIONS

This application claims benefit of priority under 35 U.S.C. § 119 to Japanese Patent Application No. 2018-173085, filed on Sep. 14, 2018, the entire contents of which is incorporated by reference herein.

TECHNICAL FIELD

The present invention relates to a semiconductor element and a semiconductor device.

BACKGROUND ART

In a drive circuit for automotive use, a semiconductor switch is arranged on an upstream side thereof to prevent a breakdown in an electronic control unit (ECU) or the like. When an abnormality occurs in the drive circuit or the like, the circuit is interrupted by the semiconductor switch to protect the ECU. Additionally, in electric circuits for use in vehicles or the like, reverse battery connection is sometimes accidentally made. Therefore, there has been a desire for a technology that prevents breakdowns in ECUs or the like.

To prevent breakdowns in such electric circuits or the like, there have been conventionally used integrated circuits including a semiconductor switch formed by bidirectionally arranging discrete n-type metal oxide semiconductor (MOS) transistors or the like. In the conventional integrated circuits, for example, a source electrode of a first MOS transistor and a source electrode of a second MOS transistor are connected to prevent a breakdown due to reverse battery connection. Additionally, a body diode (parasitic diode) is connected to each of the first MOS transistor and the second MOS transistor so that conduction direction is reversed. When using such an integrated circuit as a semiconductor switch, electric power is supplied in a state where the first MOS transistor and the second MOS transistor are conducted to each other when in normal use. In this case, while the first MOS transistor is connected in a normal direction, the second MOS transistor is connected in a reversed direction. The second MOS transistor can be brought into the conduction state by increasing gate voltage. In addition, the body diode of the second MOS transistor is forward connected, so that current flows also through the body diode.

In the integrated circuit forming the semiconductor switch or the like, when large current flows due to abnormality in a load or the like, the first MOS transistor and the second MOS transistor are interrupted to prevent a breakdown in the load or the like. Additionally, when battery is reversely connected, the body diode of the first MOS transistor is forward connected, whereby current may flow reversely. Due to that, the second MOS transistor is interrupted to prevent a breakdown in the electric circuit, wires, and the like connected to a power supply via the integrated circuit.

Note that FIG. 1, FIG. 5, and paragraph [0018] of PTL 1 mention that a first MOS field effect transistor (MOSFET) element region and a second MOSFET element region are formed on a single substrate (semiconductor chip). Additionally, paragraphs [0006], [0022], and [0023] of PTL 1 mention that a shield metal layer is provided in a floating state on the perimeter of an end portion of the substrate, and arranged also at a boundary between the first MOSFET element region and the second MOSFET element region to be shared by the two element regions. Furthermore, paragraphs [0006] and [0024] of PTL 1 mention that a metal layer or an n-type impurity region is formed on an n-type semiconductor substrate below the shield metal layer at the boundary between the first MOSFET element region and the second MOSFET element region. In addition, FIG. 3 of PTL 1 illustrates a circuit diagram in which a drain of the first MOSFET is connected to a drain of the second MOSFET.

FIG. 22, FIG. 30, and paragraphs [0015] and [0105] of PTL 2 mention that two MOSFET regions are provided on a semiconductor chip, and an n+ type channel stopper region or regions separated by trenches are provided at a boundary between the two MOSFET regions. Additionally, paragraph of PTL 2 mentions that regions separated by trenches, which are similar to those at the boundary between the two MOSFET regions, are provided at a boundary between the MOSFET regions and a high breakdown voltage structure portion. FIG. 23 of PTL 2 illustrates a circuit diagram in which drain terminals of the two MOSFETs are connected to each other.

CITATION LIST

Patent Literature

PTL 1: JP 2009-88006 A
PTL 2: JP 2016-21539 A

SUMMARY OF INVENTION

Technical Problem

When current flows to a MOSFET, heat is generated in proportion to the product of the resistance and the square of the current. The heat causes temperature rise in the MOSFET, whereby characteristics of the MOSFET, such as threshold value, may fluctuate, causing a malfunction in a semiconductor switch including the MOSFET. Additionally, the temperature rise may also cause a breakdown in the semiconductor switch.

The present invention has been accomplished in view of the above problems. It is an object of the present invention to provide a semiconductor element and a semiconductor device capable of reducing possibilities of malfunctions and breakdowns due to temperature rise.

Solution to Problem

To achieve the above object, a semiconductor element according to an aspect of the present invention includes a semiconductor substrate including a first region and a second region adjacent to each other, a first transistor provided in the first region, a second transistor provided in the second region, and a temperature detecting element provided on the semiconductor substrate. The first transistor includes a first source region of a first conductivity type, a first semiconductor region of the first conductivity type arranged away from the first source region, and a first well region of a second conductivity type arranged between the first source region and the first semiconductor region. The second transistor includes a second source region of the first conductivity type, a second semiconductor region of the first conductivity type arranged away from the second source region, and a second well region of the second conductivity type arranged between the second source region and the second semiconductor region. The first semiconductor region is connected to the second semiconductor region.

A semiconductor element according to another aspect of the present invention includes a semiconductor substrate including a first region and a second region adjacent to each other, a first transistor provided in the first region, a second transistor provided in the second region, and a temperature detecting element provided on the semiconductor substrate. A drain of the first transistor is connected to a drain of the second transistor.

A semiconductor device according to an aspect of the present invention includes any one of the above semiconductor elements and a control element connected to the semiconductor element. The control element turns on and off the first transistor and the second transistor.

Advantageous Effects of Invention

According to the present invention, there can be provided a semiconductor element and a semiconductor device capable of reducing the possibilities of malfunctions and breakdowns due to temperature rise.

DESCRIPTION OF EMBODIMENTS

Exemplary embodiments of the present invention will be described hereinbelow. In the following description of the drawings, the same or similar portions are denoted by the same or similar reference signs. However, it should be noted that the drawings are schematic, and the relationship between thickness and planar dimensions, the ratios of thickness between respective devices and between respective members, and the like are different from actual ones. Thus, specific thicknesses and dimensions should be determined in consideration of the description given below. It is also obvious that there are some portions different in mutual dimensional relationships and ratios between the drawings.

In addition, in the following description, Z axis positive direction may be referred to as "upper", and Z axis negative direction may be referred to as "lower". The terms "upper" and "lower" do not necessarily mean a vertical direction relative to the ground. In short, "upper" and "lower" directions are not limited to the direction of gravity. The terms "upper" and "lower" are merely expressions used for convenience that specify a relative positional relationship between regions, layers, films, substrates, or the like, and do not limit the technological idea of the present invention. For example, when the paper surface is rotated by 180 degrees, it is obvious that "upper" turns to "lower", and "lower" turns to "upper".

Additionally, in the following description, directions may be described using the terms "X axis direction", "Y axis direction", and "Z axis direction". For example, the X axis direction and the Y axis direction are directions parallel to one surface 1a of a support substrate 1 to be described later. The Z axis direction is a thickness direction of a semiconductor element 50 to be described later. The X axis direction, the Y axis direction, and the Z axis direction are orthogonal to one another. In addition, in the following description, the term "planar view" means to view from a normal direction (i.e., the Z axis direction) of the one surface 1a of the support substrate 1.

Furthermore, the following description will exemplify a case where first conductivity type is n-type, and second conductivity type is p-type. However, the conductivity types may be selected in an opposite relationship, in which the first conductivity type may be p-type, and the second conductivity type may be n-type. Additionally, symbols "+" and "−" added to "p" and "n" indicate that the respective semiconductor regions have a relatively high or low impurity concentration as compared with those without "+" and "−". However, it is not meant that respective semiconductor regions with the same symbol "p" have exactly the same impurity concentration.

Circuit Structure of Semiconductor Device

Figure 1:
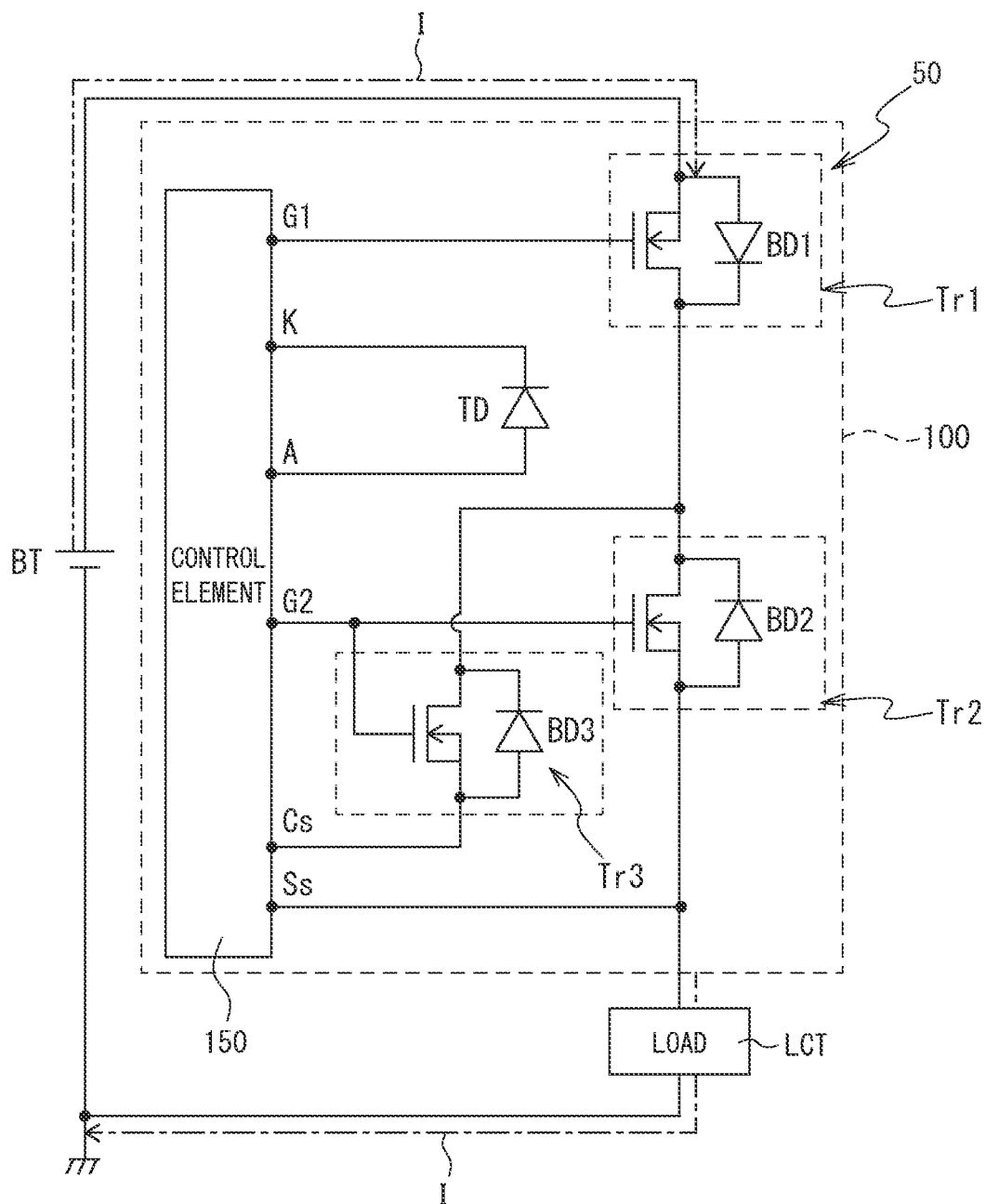
FIG. 1 is a circuit diagram illustrating a structural example of a semiconductor device according to an embodiment of the present invention.

FIG. 1 is a circuit diagram illustrating a structural example of a semiconductor device according to an embodiment of the present invention. A semiconductor device 100 according to the embodiment of the present invention is, for example, a protection device that is connected between a power supply unit BT and a load LCT to prevent a breakdown in the load LCT due to reverse connection of the power supply unit BT. The reverse connection means that a positive electrode and a negative electrode are connected in opposite directions to the normal. The kind of the load LCT is not limited, and one example thereof is an electronic control unit (ECU) that is installed in vehicles. FIG. 1 illustrates an example in which the positive and negative electrodes of the power supply unit BT are properly connected (i.e., normally connected) to the load LCT.

As illustrated in FIG. 1, the semiconductor device 100 includes the semiconductor element 50 used as a semiconductor switch and a control element 150 configured to control switching operation of the semiconductor element 50. The semiconductor element 50 includes a first MOS transistor Tr1, a second MOS transistor Tr2, a third MOS transistor Tr3, and a temperature detecting element TD. The semiconductor element 50 also includes a drain electrode pad DEP, a source electrode pad SEP, a first gate electrode pad G1, a second gate electrode pad G2, a cathode electrode pad K, an anode electrode pad A, a current detecting electrode pad Cs, and a potential detecting electrode pad Ss.

The first MOS transistor Tr1 and the second MOS transistor Tr2 are n-channel type power MOSFETs designed to handle large electric power. The first MOS transistor Tr1 includes a first body diode BD1. The second MOS transistor Tr2 includes a second body diode BD2. The first body diode BD1 is a parasitic diode formed between a well region 31 (see FIG. 3) to be described later and a first semiconductor region 21 (see FIG. 3). A forward direction of the first body diode BD1 is a direction from a source of the first MOS transistor Tr1 toward a drain thereof. The second body diode BD2 is a parasitic diode formed between the well region 31 and a second semiconductor region 22 (see FIG. 3). A forward direction of the second body diode BD2 is a direction from a source of the second MOS transistor Tr2 toward a drain thereof.

In an n-channel type MOSFET, usually, drain is connected to a high potential side, and source is connected to a low potential side. However, as illustrated in FIG. 1, the first MOS transistor Tr1 is reversely connected to the power supply unit BT and the second MOS transistor Tr2. For example, the source of the first MOS transistor Tr1 is connected to the positive electrode of the power supply unit BT, and the drain of the first MOS transistor Tr1 is connected to the drain of the second MOS transistor Tr2. The source of the second MOS transistor Tr2 is connected to a power supply input terminal of the load LCT.

As a result, in a current path from the power supply unit BT to the load LCT, conduction directions of the first body diode BD1 of the first MOS transistor Tr1 and the second body diode BD2 of the second MOS transistor Tr2 are reversed to each other. The first body diode BD1 is forward connected to the power supply unit BT, and the second body diode BD2 is reversely connected thereto.

A gate of the first MOS transistor Tr1 is connected to the control element 150 via the first gate electrode pad G1. A gate of the second MOS transistor Tr2 is connected to the control element 150 via the second gate electrode pad G2. Turning on and off (i.e., a drain-to-source conduction state) of each of the first MOS transistor Tr1 and the second MOS transistor Tr2 is controlled by the control element 150.

Additionally, the source of the second MOS transistor Tr2 is connected to the control element 150 via the potential detecting electrode pad Ss. This allows the control element 150 to detect a source potential of the second MOS transistor Tr2.

Note that the potential detecting electrode pad Ss may be integrated with a source electrode SE, without being separated therefrom, or the source electrode SE and the control element 150 may be directly connected to each other.

The third MOS transistor Tr3 is an n-channel type MOSFET designed to handle smaller electric power as compared with that of the first MOS transistor Tr1 and the second MOS transistor Tr2. A drain of the third MOS transistor Tr3 is connected to the drain of the second MOS transistor Tr2. A source of the third MOS transistor Tr3 is connected to the control element 150 via the current detecting electrode pad Cs. A gate of the third MOS transistor Tr3 is connected to the control element 150 via the second gate electrode pad G2. This allows the control element 150 to control turning on and off of the third MOS transistor Tr3. When the third MOS transistor Tr3 is turned on, a very small part of a current I (for example, approximately $1/10000$ of the current I) flowing from the power supply unit BT to the load LCT is supplied to the control element 150 via the third MOS transistor Tr3 and the current detecting electrode pad Cs. The third MOS transistor Tr3 includes a third body diode BD3.

The control element 150 can calculate a value of the current I flowing from the power supply unit BT to the load LCT on the basis of a current value supplied from the current detecting electrode pad Cs. For example, assume a case where the current supplied via the current detecting electrode pad Cs is designed to be $1/10000$ of the current I flowing from the power supply unit BT to the load LCT. In this case, the control element 150 can calculate the value of the current I by multiplying a detected current value by 10000.

The temperature detecting element TD is arranged at a position overlapping with the current path between the first MOS transistor Tr1 and the second MOS transistor Tr2 in a planar view. The temperature detecting element TD includes, for example, a plurality of p-n junction diodes (see FIG. 16). The plurality of p-n junction diodes is connected in series to form the temperature detecting element TD. An anode side end portion of the temperature detecting element TD is connected to the control element 150 via the anode electrode pad A. A cathode side end portion of the temperature detecting element TD is connected to the control element 150 via the cathode electrode pad K. This allows the control element 150 to detect current-voltage characteristics of the temperature detecting element TD via the anode electrode pad A and the cathode electrode pad K. Additionally, forward current-voltage characteristics of the temperature detecting element TD correlate with temperature. The temperature detecting element TD has characteristics in which as temperature increases, voltage decreases with respect to current flowing forward. Thus, the control element 150 can detect a temperature of the temperature detecting element TD and a vicinity thereof by detecting the current-voltage characteristics of the temperature detecting element TD.

Circuit Operation of Semiconductor Device

When the power supply unit BT is normally connected to the load LCT, the first MOS transistor Tr1 is reversely connected, and the first body diode BD1 is forward connected. Additionally, the second MOS transistor Tr2 is forward connected, and the second body diode BD2 is reversely connected. When the control element 150 transmits a voltage signal for turning on the first MOS transistor Tr1 and the second MOS transistor Tr2 to each of the gates thereof, the current I flows from the power supply unit BT to the load LCT through the first MOS transistor Tr1, the first body diode BD1, and the second MOS transistor Tr2, as indicated by a two-dot chain line of FIG. 1. Although the first MOS transistor Tr1 is reversely connected to the power supply unit BT, a sufficiently high voltage signal as compared with a threshold voltage is applied to the gate, whereby the first MOS transistor Tr1 is brought into a conduction state.

On the other hand, when the positive and negative electrodes of the power supply unit BT are improperly connected (i.e., reversely connected) to the load LCT, the second MOS transistor Tr2 is reversely connected, and the second body diode BD2 is forward connected. In addition, the first MOS transistor Tr1 is forward connected, and the first body diode BD1 is reversely connected. In this case, the control element 150 transmits a voltage signal for turning off the first MOS transistor Tr1 and the second MOS transistor Tr2 to the gates thereof. As a result, since the first MOS transistor Tr1 and the second MOS transistor Tr2 are turned off, the semiconductor element 50 can interrupt current even though the second body diode BD2 is in the conduction state.

The control element 150 can detect whether or not the power supply unit BT is reversely connected to the load LCT. For example, when the power supply unit BT is reversely connected to the load LCT, the source potential of the second MOS transistor Tr2 becomes higher than that when in normal connection, and is substantially the same potential as that of the positive electrode of the power supply unit BT. The source potential of the second MOS transistor Tr2 is input to the control element 150 via the potential detecting electrode pad Ss. As a result, the control element 150 can determine whether or not the power supply unit BT is reversely connected to the load LCT by detecting the source potential of the second MOS transistor Tr2 via the potential detecting electrode pad Ss and then comparing the detected value with a previously set value.

Additionally, the control element 150 detects abnormality of the semiconductor element 50 not only when in reverse connection but also even when in normal connection in the semiconductor element 50, and then transmits a voltage signal for turning off the first MOS transistor Tr1 and the second MOS transistor Tr2 to the gates thereof. For example, when an abnormality occurs in the load LCT or and thereby the current I flowing through the semiconductor device 100 exceeds a prescribed value or the temperature detected by the temperature detecting element TD exceeds a prescribed value, the control element 150 transmits a voltage signal for turning off the first MOS transistor Tr1 and the second MOS transistor Tr2 to the gates thereof. As a result, since the first MOS transistor Tr1 and the second MOS transistor Tr2 are turned off, the semiconductor element 50 can interrupt the current even though the first body diode BD1 is in the conduction state. Thus, when an abnormality occurs in the semiconductor element 50 used as a semiconductor switch, the control element 150 turns off the first MOS transistor Tr1 and the second MOS transistor Tr2 to prevent malfunctions in the semiconductor element 50.

Structure of Semiconductor Element

Figure 2:
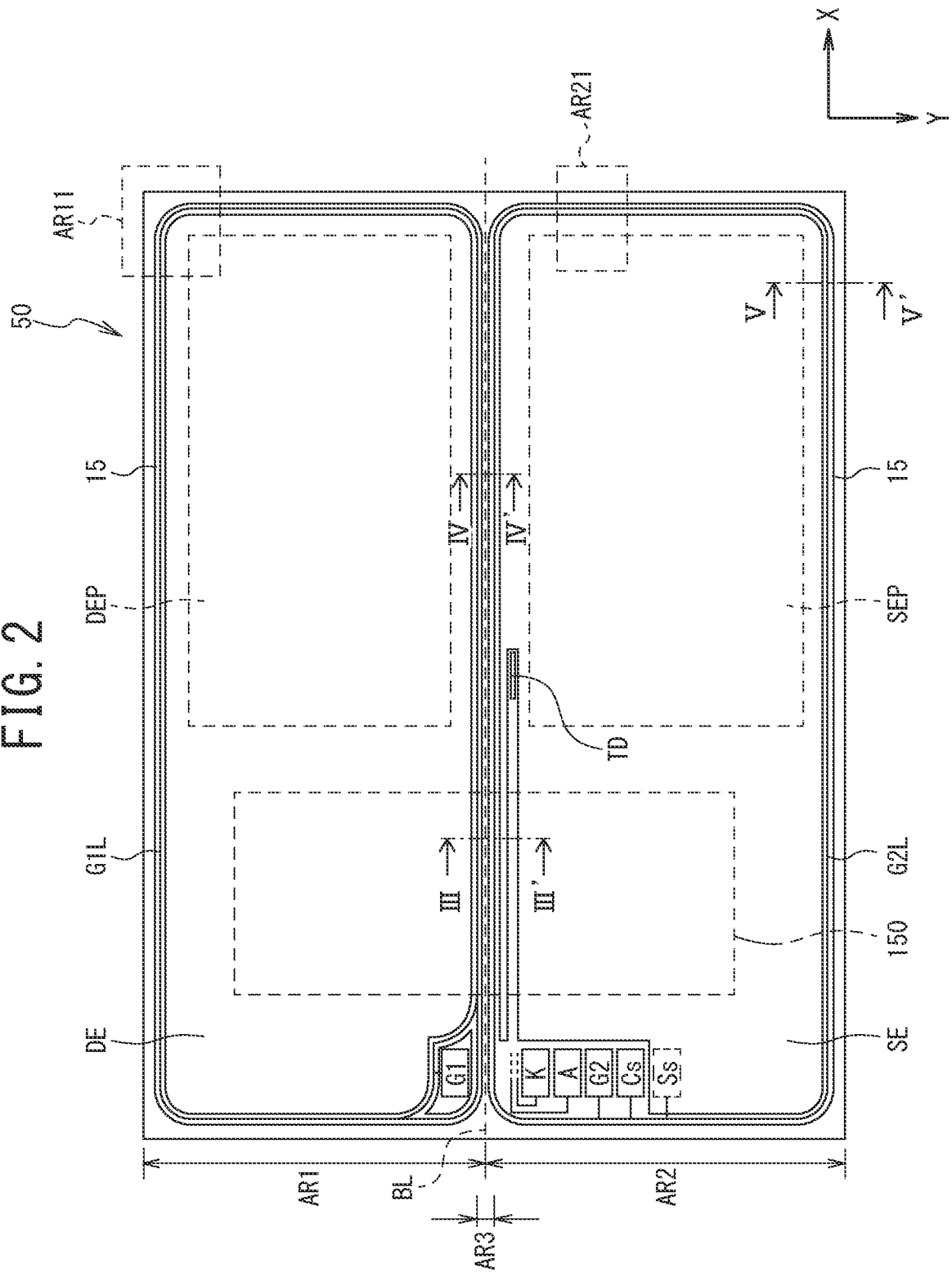
FIG. 2 is a plan view illustrating a structural example of a semiconductor element according to an embodiment of the present invention.
Figure 3:
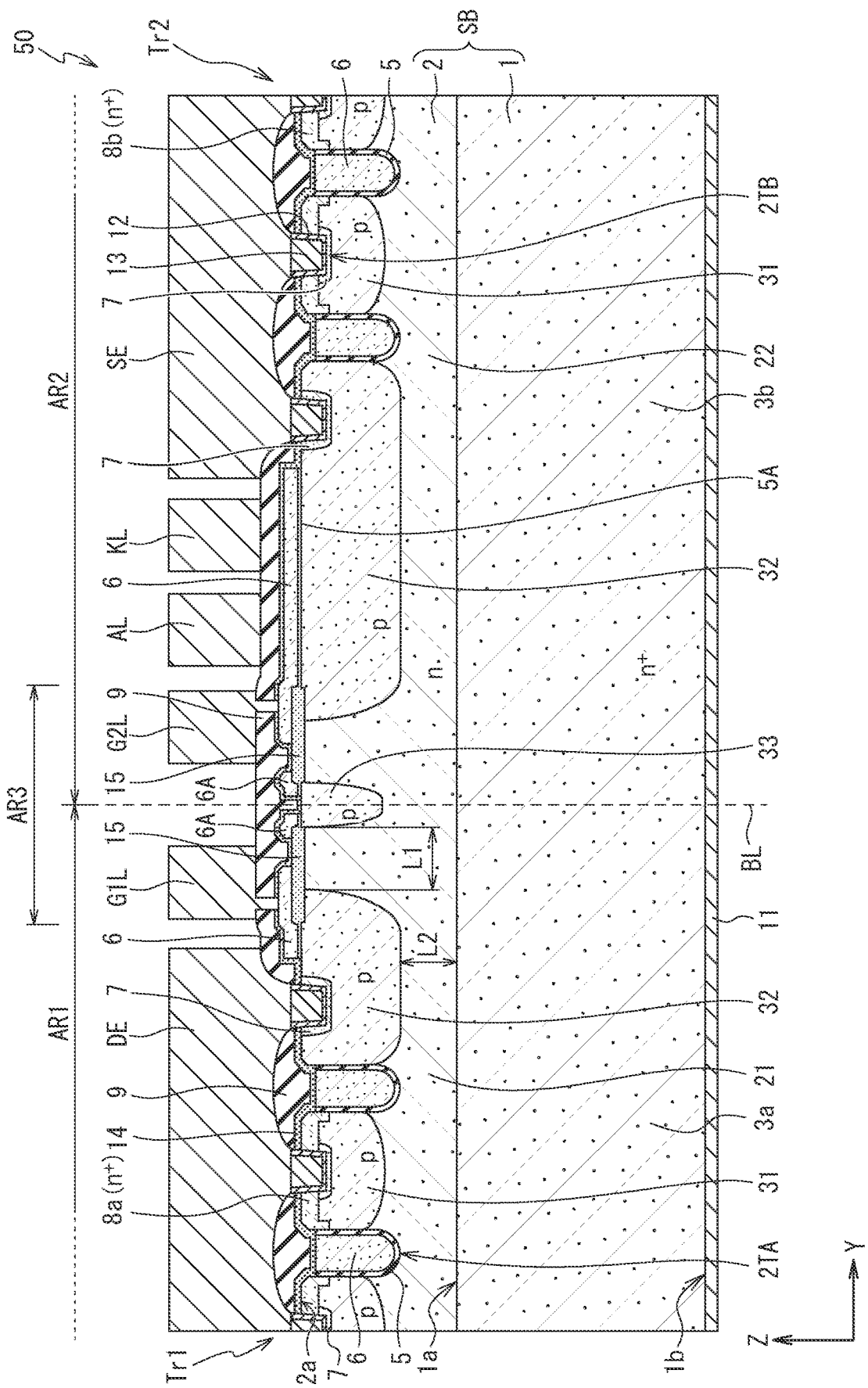
FIG. 3 is a cross-sectional view taken along line of the plan view illustrated in FIG. 2.
Figure 4:
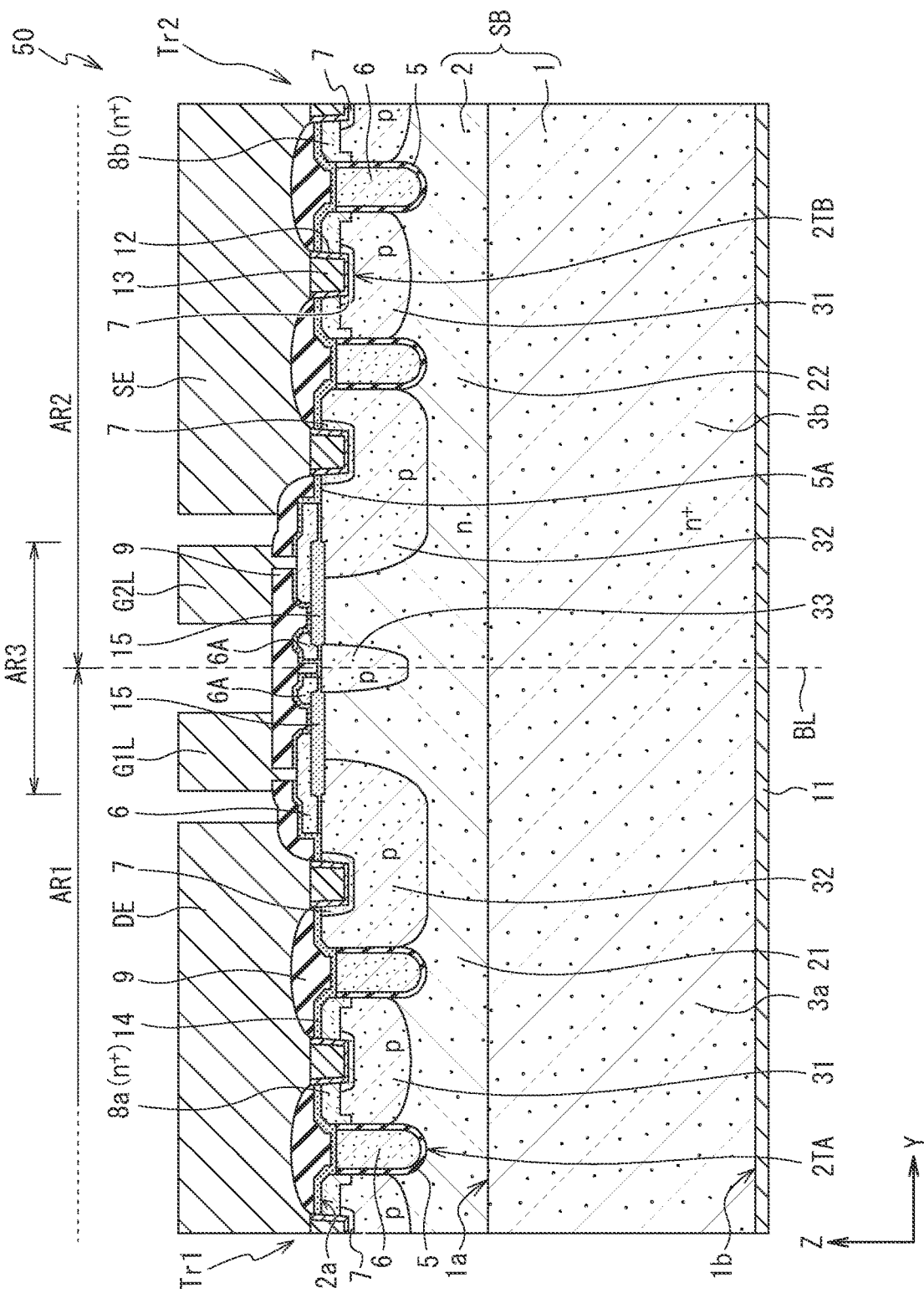
FIG. 4 is a cross-sectional view taken along line of the plan view illustrated in FIG. 2.
Figure 5:
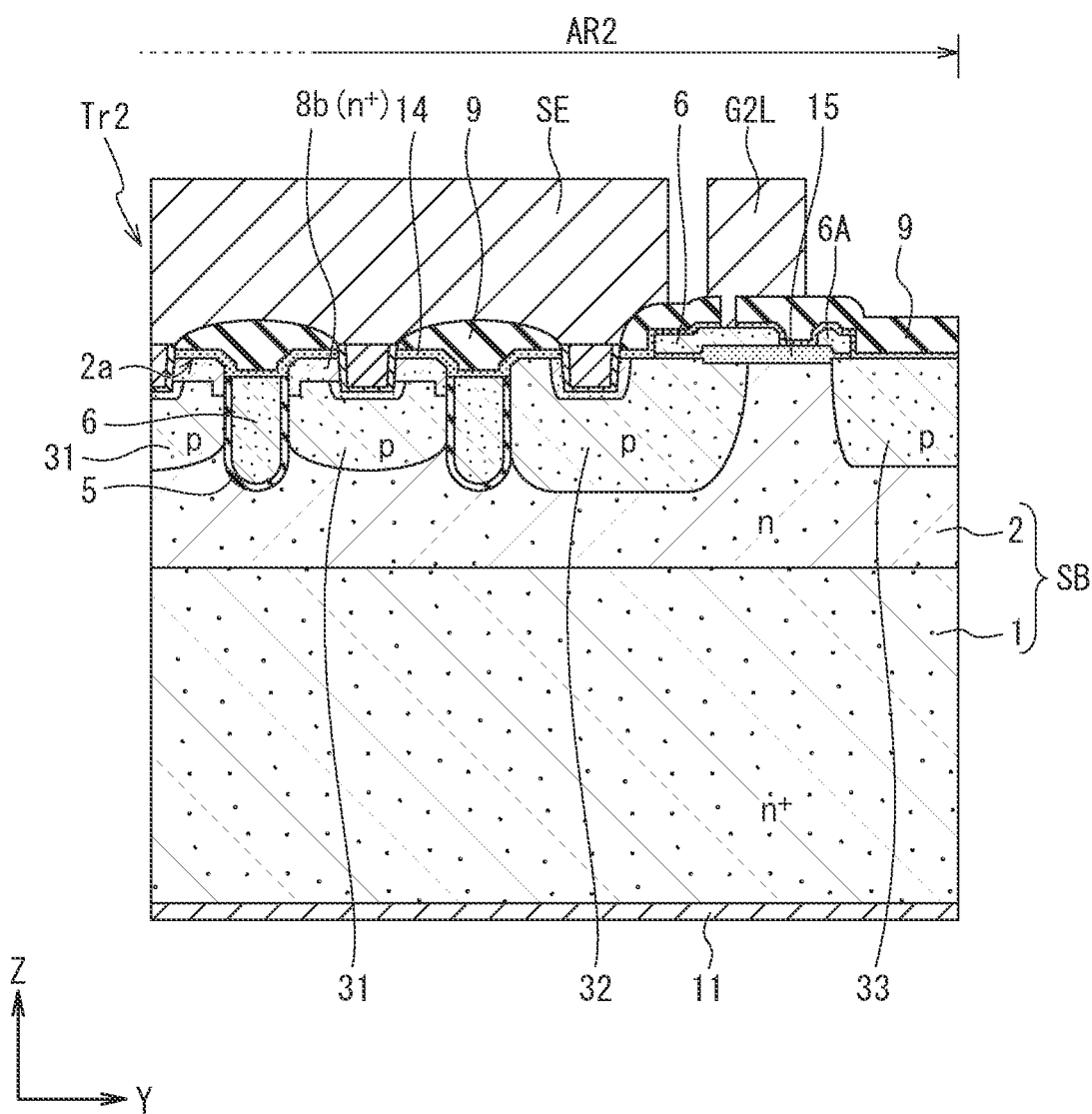
FIG. 5 is a cross-sectional view taken along line V-V' of the plan view illustrated in FIG. 2.

FIG. 2 is a plan view illustrating a structural example of a semiconductor element according to an embodiment of the present invention. In FIG. 2, a first gate wire G1L and a second gate wire G2L, respectively, are indicated by lines. FIG. 3 is a cross-sectional view taken along line III-III' of the plan view illustrated in FIG. 2. FIG. 3 illustrates a cross-section of a portion including an anode wire AL and a cathode wire KL electrically connected to the temperature detecting element TD. FIG. 4 illustrates a cross-sectional views taken along line IV-IV' or the plan view illustrated in FIG. 2. FIG. 4 illustrates a cross-section of a portion not including the temperature detecting element TD. FIG. 5 is a cross-sectional view taken along line V-V' of the plan view illustrated in FIG. 2. FIG. 5 illustrates a cross-section of a linear region parallel to the Y axis direction in an outer peripheral portion of a second region AR2. Note that FIG. 2 to FIG. 5 do not illustrate a protecting film 60 illustrated in FIG. 23.

As illustrated in FIG. 2 to FIG. 4, the semiconductor element 50 according to the embodiment includes a semiconductor substrate SB, the first MOS transistors Tr1, and the second MOS transistor Tr2 that are provided on the semiconductor substrate SB. For example, the semiconductor substrate SB includes a support substrate 1 and a semiconductor layer 2 formed on one surface (hereinafter referred to as front surface) 1a of the support substrate 1. The support substrate 1 is a single crystal Si substrate made of silicon (Si). The semiconductor layer 2 is a single crystal Si layer formed by an epitaxial growth process on the one surface (for example, front surface) 1a of the support substrate 1. The support substrate 1 and the semiconductor layer 2, respectively, are n-type semiconductors including an n-type impurity such as phosphorus (P). The support substrate 1 has a higher n-type impurity concentration than that of the semiconductor layer 2. The support substrate 1 is an n+ region, and the semiconductor layer 2 is an n region.

The support substrate 1 may have a thickness of, for example, from 40 µm to 260 µm, and the semiconductor layer 2 may have a thickness of, for example, from 4 µm to 15 µm. The thinner the thickness of the support substrate 1, the more improved the electric characteristics. However, the thinner the support substrate 1 is, the more difficult the handling becomes in a manufacturing process, which may reduce productivity and non-defective product rate of the semiconductor element. The thickness of the semiconductor layer 2 varies depending on the voltage of the power supply unit BT, and needs to be a thickness that can maintain a breakdown voltage equal to or higher than a voltage of the connected power supply unit BT.

In addition, the impurity concentration of the support substrate 1 may be, for example, from $1 \times 10^{19}/cm^3$ to $1 \times 10^{20}/cm^3$. The impurity concentration of the semiconductor layer 2 may be, for from $2 \times 10^{15}/cm^3$ to $2 \times 10^{17}/cm^3$. The impurity concentration of the semiconductor layer 2 varies depending on the voltage of the power supply unit BT, and needs to be an impurity concentration that can give a breakdown voltage equal to or higher than the voltage of the connected power supply unit BT and can provide a desired ON-resistance.

Furthermore, in the semiconductor layer 2 are formed a p-type well region 31 including a p-type impurity such as boron (B), a p-type resurf region 32, and a p-type channel stopper region 33. The well region 31 and the channel stopper region 33 have mutually the same depth from one surface (hereinafter referred to as front surface) 2a of the semiconductor layer 2. A depth of the resurf region 32 from the front surface 2a is deeper than the depth of the well region 31 from the front surface 2a. The resurf region 32 has a p-type impurity concentration lower than or substantially the same as the p-type impurity concentration of the well region 31.

The semiconductor substrate SB includes a first region AR1 and the second region AR2 adjacent to the first region AR1. The first MOS transistor Tr1 is provided in the first region AR1 of the semiconductor substrate SB. The second MOS transistor Tr2 is provided in the second region AR2 of the semiconductor substrate SB.

In addition, as illustrated in FIG. 2, the first region AR1 is provided with the first gate electrode pad G1. The second region AR2 is provided with the second gate electrode pad G2, the cathode electrode pad K, the anode electrode pad A, the current detecting electrode pad Cs, and the potential detecting electrode pad Ss. The first gate electrode pad G1, the second gate electrode pad G2, the cathode electrode pad K, the anode electrode pad A, the current detecting electrode pad Cs, and the potential detecting electrode pad Ss are arranged side by side in the Y axis direction.

Providing a current detecting element (corresponding to the current detecting electrode pad Cs, which represents the third MOS transistor Tr3 to be described later) only in the second region AR2 enables interruption of the current flowing also through the parasitic diode in the current detecting element (third MOS transistor Tr3). It is therefore unnecessary to form such that a ratio between an area of a source region 8 of the current detecting element and an area of the parasitic diode of the current detecting element is the same as a ratio between an area of the source region 8 of the first MOS transistor Tr1 in the first region AR1 and an area of the parasitic diode of the first MOS transistor Tr1. As a result, highly accurate current detection can be performed only by optionally changing the area of the source region 8 of the current detecting element (third MOS transistor Tr3).

Shapes in a planar view (hereinafter referred to as planar shapes) of the drain electrode pad DEP and the source electrode pad SEP are mutually the same or mutually substantially the same. The planar shapes of the drain electrode pad DEP and the source electrode pad SEP are, for example, rectangular. The corners of the rectangular shape may be rounded. Areas in a planar view of the drain electrode pad DEP and the source electrode pad SEP also are mutually the same or mutually substantially the same. The drain electrode pad DEP indicates an opening portion of the protecting film 60 (unillustrated) arranged on a drain electrode DE to be described later, and the drain electrode DE is exposed from the protecting film 60. The source electrode pad SEP indicates an opening portion of the protecting film 60 (unillustrated) arranged on the source electrode SE to be described later, and the source electrode SE is exposed from the protecting film 60.

Figure 21:
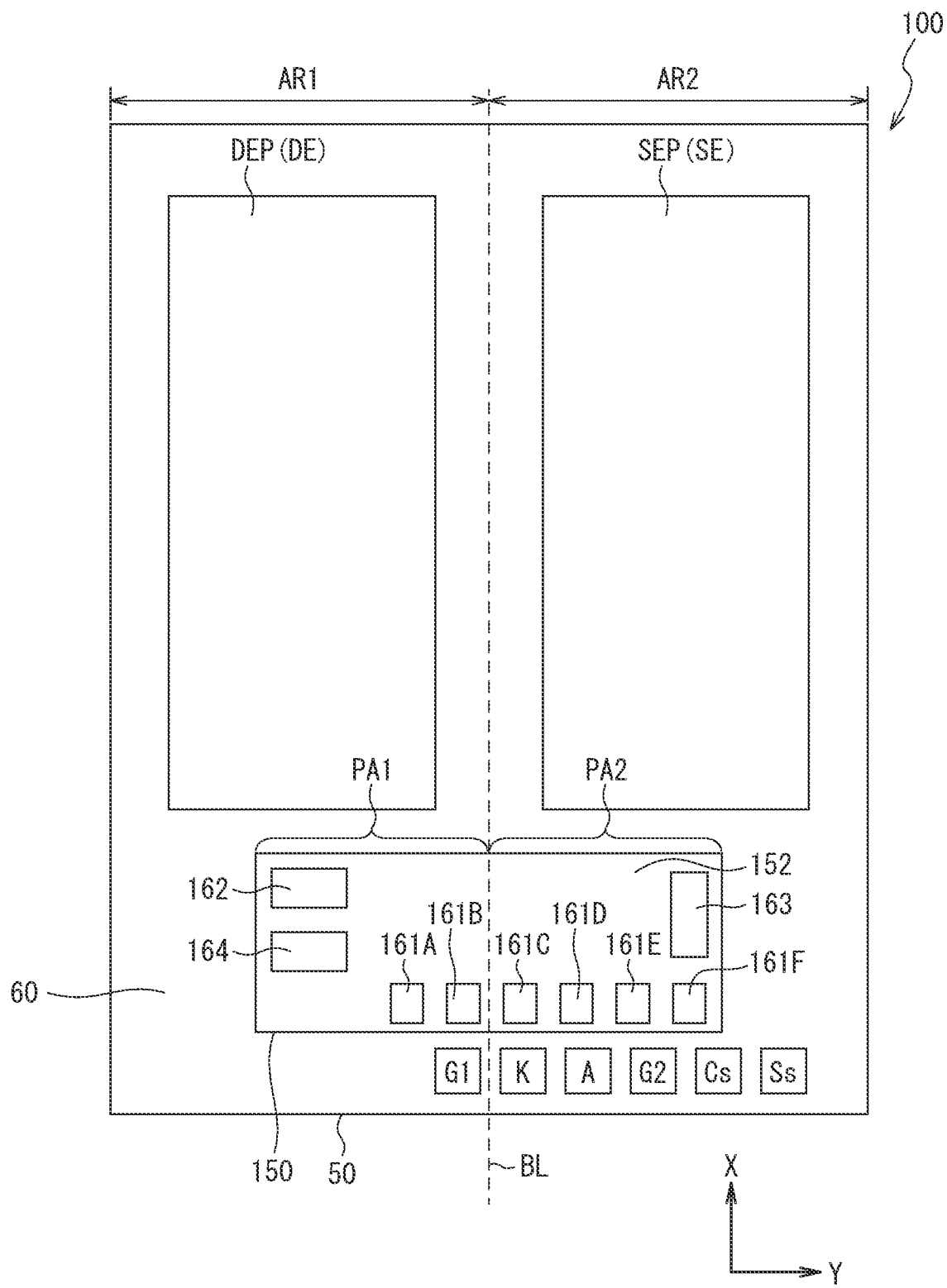
FIG. 21 is a plan view illustrating the semiconductor element according to the embodiment of the present invention and a control element in an enlarged manner.

In addition, as illustrated in FIG. 21 to be described later, the planer shapes of the first gate electrode pad G1, the second gate electrode pad G2, the cathode electrode pad K, the anode electrode pad A, the current detecting electrode pad Cs, and the potential detecting electrode pad Ss are mutually the same or mutually substantially the same. Areas in a planar view of the first gate electrode pad G1, the second gate electrode pad G2, the cathode electrode pad K, the anode electrode pad A, the current detecting electrode pad Cs, and the potential detecting electrode pad Ss also are mutually the same or mutually substantially the same.

As illustrated in FIG. 3 to FIG. 5, the first MOS transistor Tr1 and the second MOS transistor Tr2, respectively, are vertical MOS transistors with a trench gate structure. The first MOS transistor Tr1 and the second MOS transistor Tr2 are simultaneously formed in the same step.

The first MOS transistor Tr1 includes a trench 2TA provided to penetrate through the p-type well region 31 from the front surface 2a of the semiconductor layer 2 (the front surface 2a of the p-type well region 31), a gate insulating film 5 provided along an inner wall of the trench 2TA, a gate electrode 6 provided on the gate insulating film 5 and embedded in the trench 2TA via the gate insulating film 5, an n-type source region ($n^+$ region) 8a provided on the well region 31, and an n-type first semiconductor region (n region) 21 provided under the well region 31. The second MOS transistor Tr2 includes the trench 2TA provided to penetrate through the p-type well region 31 from the surface of the semiconductor layer 2 (the surface of the p-type well region 31), the gate insulating film 5 provided along the inner wall of the trench 2TA, the gate electrode 6 provided on the gate insulating film 5 and embedded in the trench 2TA via the gate insulating film 5, an n-type source region ($n^+$ region) 8b provided on the well region 31, and an n-type second semiconductor region (n region) 22 provided under the well region 31. The first semiconductor region 21 is a portion positioned in the first region AR1 of the n-type semiconductor layer 2. The second semiconductor region 22 is a portion positioned in the second region AR2 of the n-type semiconductor layer 2.

The support substrate 1 positioned in the first region AR1 is referred to as first drain region 3a of the first MOS transistor Tr1. The support substrate 1 positioned in the second region AR2 is referred to as second drain region 3b of the second MOS transistor Tr2.

In the semiconductor element 50, the first drain region 3a and the first semiconductor region 21 arranged on the first drain region 3a serve as a drift region, and the second drain region 3b and the second semiconductor region 22 arranged on the second drain region 3b serve as a drift region.

In the semiconductor element 50, the source region 8 of the first MOS transistor Tr1 is referred to as first source region 8a, and serves as drain. In the semiconductor element 50, the source region 8 of the second MOS transistor Tr2 is referred to as second source region 8b, and serves as source.

The gate insulating film 5 covers a bottom face and a side face of the trench 2TA provided in the semiconductor layer 2. The gate insulating film 5 is, for example, a silicon oxide ($SiO_2$) film. Additionally, the gate electrode 6 is embedded in the trench 2TA via the gate insulating film 5. In addition, a part of the gate electrode 6 is drawn out onto the semiconductor layer 2 covered with an insulating film, and is electrically connected to the first gate wire G1L or the second gate wire G2L. For example, in the first region AR1, the part of the gate electrode 6 drawn out onto the semiconductor layer 2 is electrically connected to the first gate wire G1L. In the second region AR2, the part of the gate electrode 6 drawn out onto the semiconductor layer 2 is electrically connected to the second gate wire G2L. The gate electrode 6 is formed by, for example, a polysilicon (poly-Si) film.

An insulating film 14 is provided on the gate electrode 6. The insulating film 14 is a high temperature silicon oxide film (HTO: high temperature oxide). Additionally, an interlayer insulating film 9 is provided on the insulating film 14. The interlayer insulating film 9 is a boron- and phosphorus-containing silicon oxide film (BPSG film).

Additionally, each of the well region 31 and the resurf region 32 is provided with a plug electrode 13 electrically connected to the source region 8. For example, the well region 31 and the resurf region 32 are provided with a trench 2TB at a position adjacent to the source region 8b in a horizontal direction. A barrier metal 12 is provided on a bottom face and a side face of the trench 2TB. In addition, the plug electrode 13 is embedded in the trench 2TB via the barrier metal 12. This allows the plug electrode 13 to be electrically connected to the source region 8 via the barrier metal 12. Additionally, in the semiconductor layer 2 near the bottom portion of the trench 2TB is provided a $p^+$ region 7 having a higher p-type impurity concentration than those of the well region 31 and the resurf region 32. This allows the plug electrode 13 to be electrically connected to each of the well region 31 and the resurf region 32 via the $p^+$ region 7. The $p^+$ region 7 serves to reduce each of a contact resistance between the well region 31 and the plug electrode 13 and a contact resistance between the resurf region 32 and the plug electrode 13.

The drain electrode DE is provided on the interlayer insulating film 9 and the plug electrode 13 in the first region AR1. The drain electrode DE is electrically connected to the plug electrode 13 of the first region AR1. In addition, the source electrode SE is provided on the interlayer insulating film 9 and the plug electrode 13 in the second region AR2. The source electrode SE is electrically connected to the plug electrode 13 of the second region AR2.

On another surface (hereinafter referred to as back surface) 1b of the support substrate 1 is provided a back surface electrode 11. The back surface electrode 11 is electrically connected to, for example, an island 111 of a lead frame 110 to be described later. The back surface electrode 11 may be, for example, a conductive film made of an aluminum alloy whose main component is aluminum, gold, or the like, or may be a laminated film thereof. The back surface electrode 11 is at floating potential.

As illustrated in FIG. 3 and FIG. 4, at a boundary BL between the first region AR1 and the second region AR2 and in the vicinity thereof (hereinafter referred to as boundary portion AR3) are provided the resurf region 32, the channel stopper region 33, a local oxidation of silicon (LOCOS) film 15, the gate electrode 6 drawn out onto the semiconductor layer 2, a field plate 6A, the first gate wire G1L, and the second gate wire G2L. The boundary BL represents a position where the boundary BL overlaps with the channel stopper region 33 in a planar view in the boundary portion AR3. The first gate wire G1L represents a wire that electrically connects the gate electrode 6 and the first gate electrode pad G1 of the first region AR1. The second gate wire G2L represents a wire that electrically connects the gate electrode 6 and the second gate electrode pad G2 of the second region AR2.

The field plate 6A is formed by, for example, a polysilicon (poly-Si) film. The field plate 6A is formed by the same polysilicon film as that of the gate electrode 6, and is simultaneously formed together with the gate electrode 6 in the same step. Note that the gate electrode 6 and the field plate 6A are electrically separated, and fixed at each different potential. For example, the gate electrode 6 of the first region AR1 is fixed at a gate potential for turning on and off the first MOS transistor Tr1. The gate electrode 6 of the second region AR2 is fixed at a gate potential for turning on and off the second MOS transistor Tr2. The field plate 6A is put at floating potential, and each of the first gate wire G1L and the second gate wire G2L serving as the metal field plates is fixed at the gate potential. Similarly to the gate electrode 6, the insulting film 14 also is provided on the field plate 6A.

Note that the field plate 6A is electrically connected to the channel stopper region 33.

As illustrated in FIG. 5, at an outer peripheral portion of the second region AR2 are provided the resurf region 32, the channel stopper region 33, the LOCOS film 15, the gate electrode 6 drawn out onto the semiconductor layer 2, the field plate 6A, and the second gate wire G2L. As illustrated in FIG. 2, the second gate wire G2L surrounds an active region of the second region AR2 in a planar view. The active region of the second region AR2 represents a region provided with the second MOS transistor Tr2. The active region may be referred to as element region. Like the second gate wire G2L, the gate electrode 6 drawn out onto the semiconductor layer 2 also surrounds the active region of the second region AR2 in a planar view.

Although unillustrated, at an outer peripheral portion of the first region AR1 also are provided the resurf region 32, the channel stopper region 33, the LOCOS film 15, the gate electrode 6 drawn out onto the semiconductor layer 2, the field plate 6A, and the first gate wire G1L, like the outer peripheral portion of the second region AR2. As illustrated in FIG. 2, the first gate wire G1L surrounds the active region of the first region AR1 in a planar view. The active region of the first region AR1 is a region provided with the first MOS transistor Tr1. Like the first gate wire G1L, the gate electrode 6 drawn out onto the semiconductor layer 2 and the field plate 6A also surround the active region of the first region AR1 in a planar view.

As illustrated above, the channel stopper region 33 is provided at the boundary portion AR3 between the first region AR1 and the second region AR2. This can prevent formation of a channel (inversion layer) at the boundary portion AR3. Additionally, the channel stopper region 33 can stop a depletion layer from extending from one of the first region AR1 or the second region AR2 to the other one. For example, when the power supply unit BT is normally connected to the load LCT, the depletion layer extends in a horizontal direction from the resurf region 32. The horizontal extension of the depletion layer stops when the depletion layer reaches the channel stopper region 33. This can prevent an unintended parasitic element from being formed at the boundary portion AR3, so that breakdown voltage of the boundary portion AR3 can be increased.

Note that a distance L1 between the resurf region 32 and the channel stopper region 33 adjacent to each other is sufficiently longer than a distance L2 between the resurf region 32 and the support substrate 1. For example, while the distance L2 is several µm, the distance L1 is several tens of µm. Specifically, while the distance L2 is from 2 µm to 10

μm, the distance L1 is from 20 μm to 60 μm. It suffices that the distance L1 is 5 times or more than the distance L2.

In addition, the first gate wire G1L and the second gate wire G2L serve not only as wires but also as field plates of metal. Furthermore, not only the field plate 6A but also the gate electrode 6 drawn out onto the semiconductor layer 2 serves as a field plate of polysilicon. The field plates of metal and the field plate of polysilicon can reduce electric field intensity of the surface 2a of the semiconductor layer 2 and in the vicinity thereof, and serve to facilitate horizontal extension of the depletion layer formed on the surface 2a of the semiconductor layer 2 and in the vicinity thereof. This enables each of the outer peripheral portion of the first region AR1, the outer peripheral portion of the second region AR2, and the boundary portion AR3 to have high breakdown voltage.

Additionally, in the first region AR1, the well region 31 is formed to be shallower than the trench 2TA, whereas the resurf region 32 is formed to be deeper than the trench 2TA. As a result, electric field intensity at the bottom of a terminal end portion of the trench 2TA can be reduced as compared with a case where the resurf region 32 is formed to have the same depth as that of the well region 31, thereby enabling the depletion layer to be more widely extended in both horizontal and depthwise directions. Note that the same applies also to the second region AR2. As a result, breakdown voltage can be further increased in the outer peripheral portion of the first region AR1, the outer peripheral portion of the second region AR2, and the boundary portion AR3.

Thus, in each of the outer peripheral portion of the first region AR1, the outer peripheral portion of the second region AR2, and the boundary portion AR3, the channel stopper region 33, the resurf region 32, the LOCOS film 15, and the field plate 6A serve as a high breakdown voltage structure portion. Additionally, in the outer peripheral portion of the first region AR1, the outer peripheral portion of the second region AR2, and the boundary portion AR3, the gate electrode 6 (the field plate of polysilicon) drawn out onto the semi conductor layer 2, the first gate wire G1L, and the second gate wire G2L (the field plates of metal) also serve as a high breakdown voltage structure portion.

Additionally, as illustrated in FIG. 2, the temperature detecting element TD is arranged in the second region AR2. For example, the temperature detecting element TD is provided in the second region AR2, and arranged in the vicinity of the boundary portion AR3. The temperature detecting element TD is provided further inward than the second gate wire G2L in the second region AR2 in a planar view. In addition, as illustrated in FIG. 3, the anode wire AL and the cathode wire KL also are arranged in the vicinity of the boundary portion AR3 in the second region AR2. The anode wire AL and the cathode wire KL also are provided further inward than the second gate wire G2L in the second region AR2. The anode wire AL and the cathode wire KL are extended onto the interlayer insulating film 9. The structure of the temperature detecting element TD will be described later with reference to FIG. 16 and FIG. 17.

Figure 6:
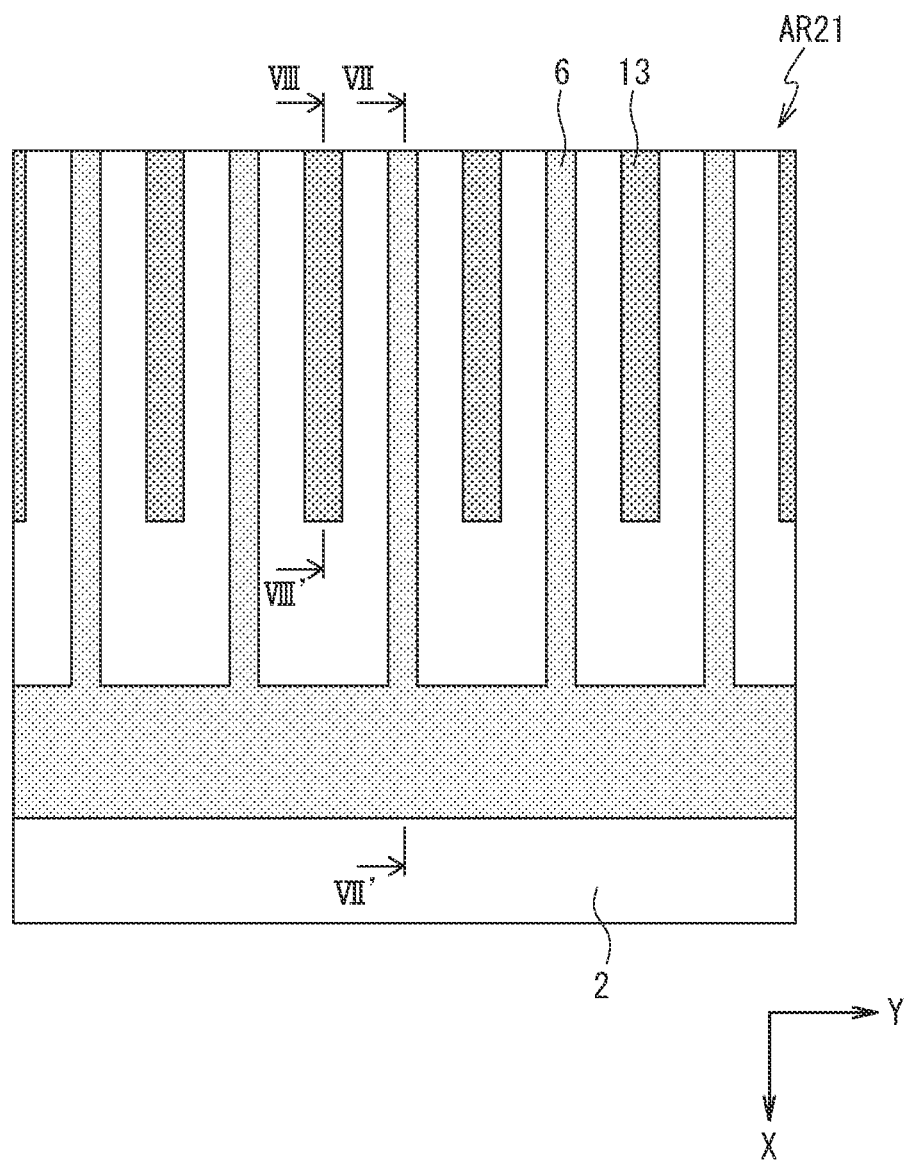
FIG. 6 is a plan view illustrating a structural example of a vicinity of an outer peripheral portion in an active region of the semiconductor element according to the embodiment of the present invention.
Figure 7:
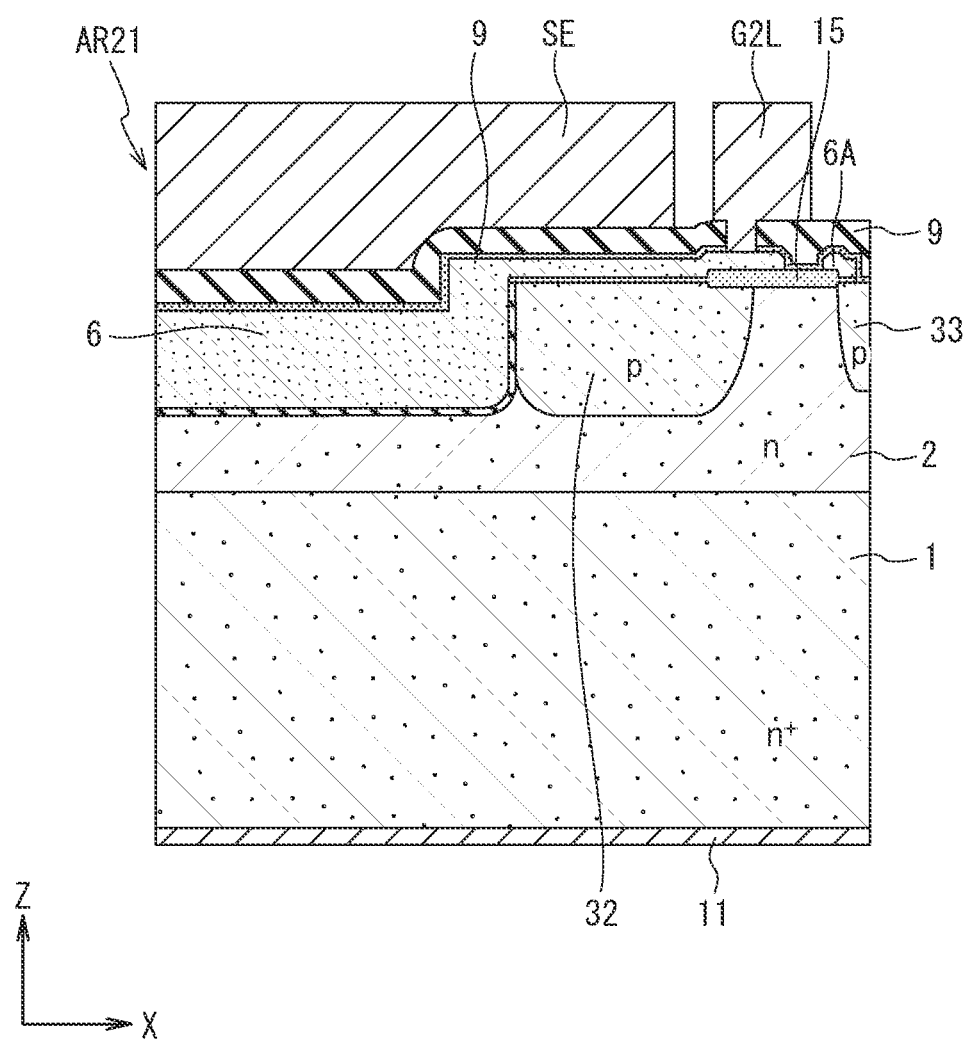
FIG. 7 is a cross-sectional view taken along line VII-VII' of FIG. 6.
Figure 8:
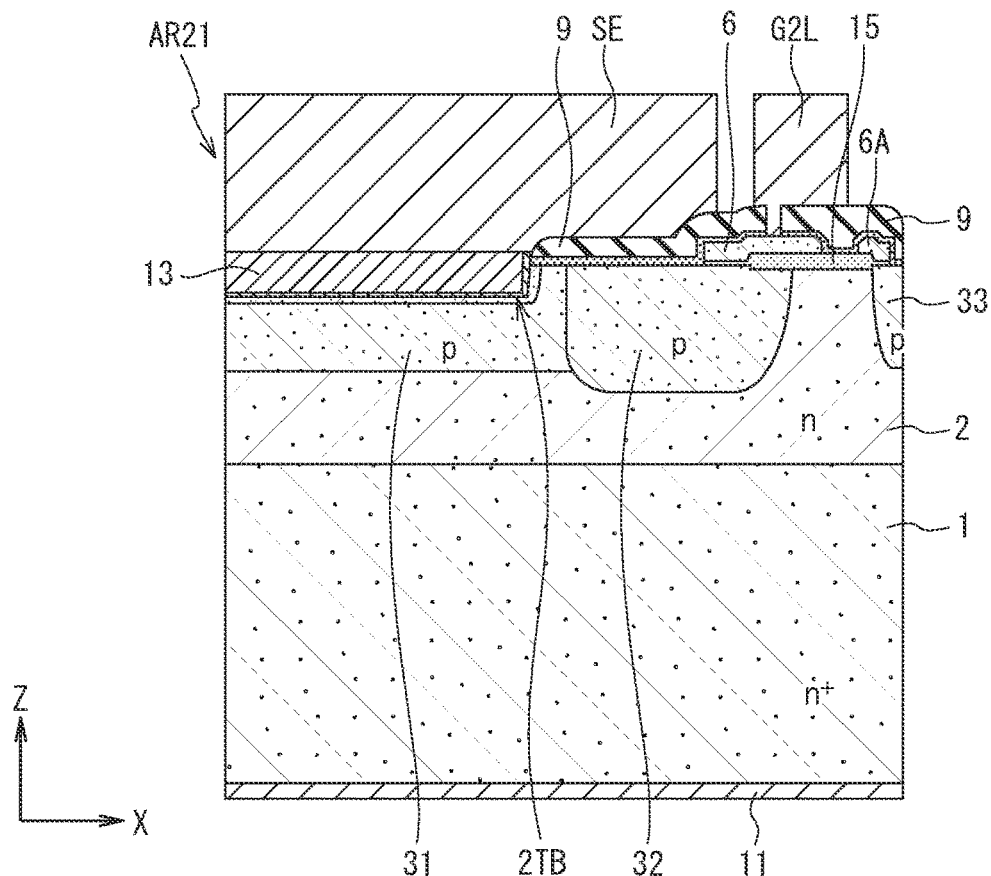
FIG. 8 is a cross-sectional view taken along line VIII-VIII' of FIG. 6.

FIG. 6 is a plan view illustrating a structural example of a vicinity of an outer peripheral portion in the active region of the semiconductor element according to the embodiment of the present invention. FIG. 6 illustrates, in an enlarged manner, a region AR21 surrounded by a broken line in the second region AR2 illustrated in FIG. 2, while omitting the interlayer insulating 9, the source electrode SE, and the protecting film 60 illustrated in FIG. 23. The region AR21 includes the active region of the second region AR2 and the outer peripheral portion thereof. FIG. 7 is a cross-sectional view taken along line VII-VII' of FIG. 6. FIG. 8 is a cross-sectional view taken along line VIII-VIII' of FIG. 7. As illustrated in FIG. 6 to FIG. 8, the gate electrode 6 and the plug electrode 13, respectively, are extended toward one direction (for example, the Y axis direction). Additionally, the gate electrode 6 and the plug electrode 13 are alternately arranged toward the other direction (for example, the X axis direction) orthogonal to the one direction in a planar view. Note that FIG. 7 and FIG. 8 also do not illustrate the protecting film 60 illustrated in FIG. 23.

The gate electrode 6 it extended from the active region positioned inside the second region AR2 to the outer peripheral portion thereof, and then drawn out onto the semiconductor layer 2 from inside the trench 2TA at the outer peripheral portion thereof. End portions of the gate electrode 6 are connected to each other. A portion connecting the end portions of the gate electrode 6 to each other may be provided in such a manner as to surround the active region. As described above, the gate electrode 6 drawn out onto the semiconductor layer 2 serves as the field plate of polysilicon. On the other hand, the plug electrode 13 is formed only in the active region of the second region AR2, and is not extended to the outer peripheral portion thereof. The plug electrode 13 is provided only in the trench 2TB.

Note that although unillustrated, the vicinity of the outer peripheral portion of the first region AR1 also has the same structure as that of the vicinity of the outer peripheral portion of the second region AR2 illustrated in FIG. 6 to FIG. 8. For example, the vicinity of the outer peripheral portion of the first region AR1 has a structure in which, in FIG. 7 and FIG. 8, the source electrode SE is replaced with the drain electrode DE, and the second gate wire G2L, is replaced with the first gate wire G1L.

Figure 9:
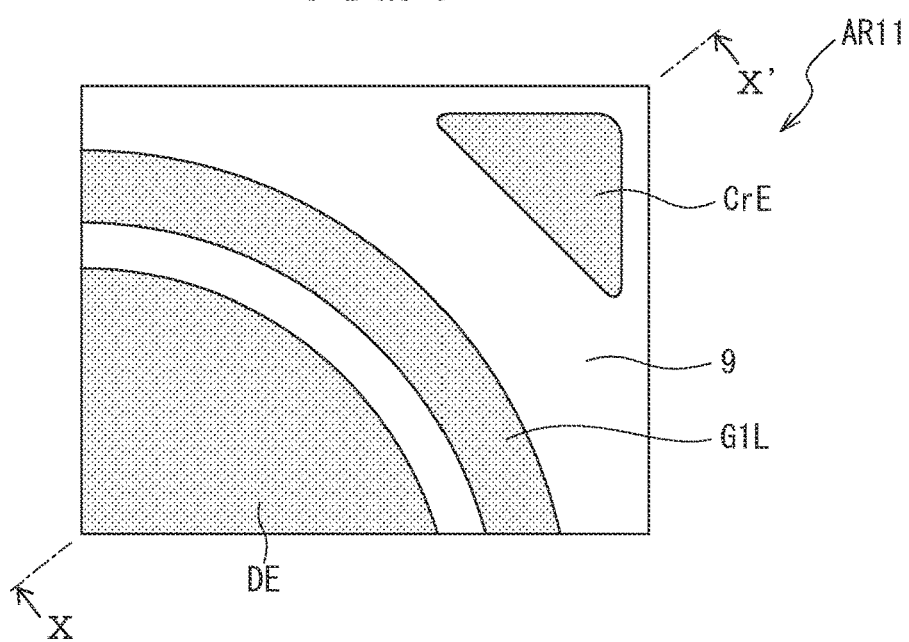
FIG. 9 is a plan view illustrating a structural example of a corner portion of the semiconductor element according to the embodiment of the present invention.
Figure 10:
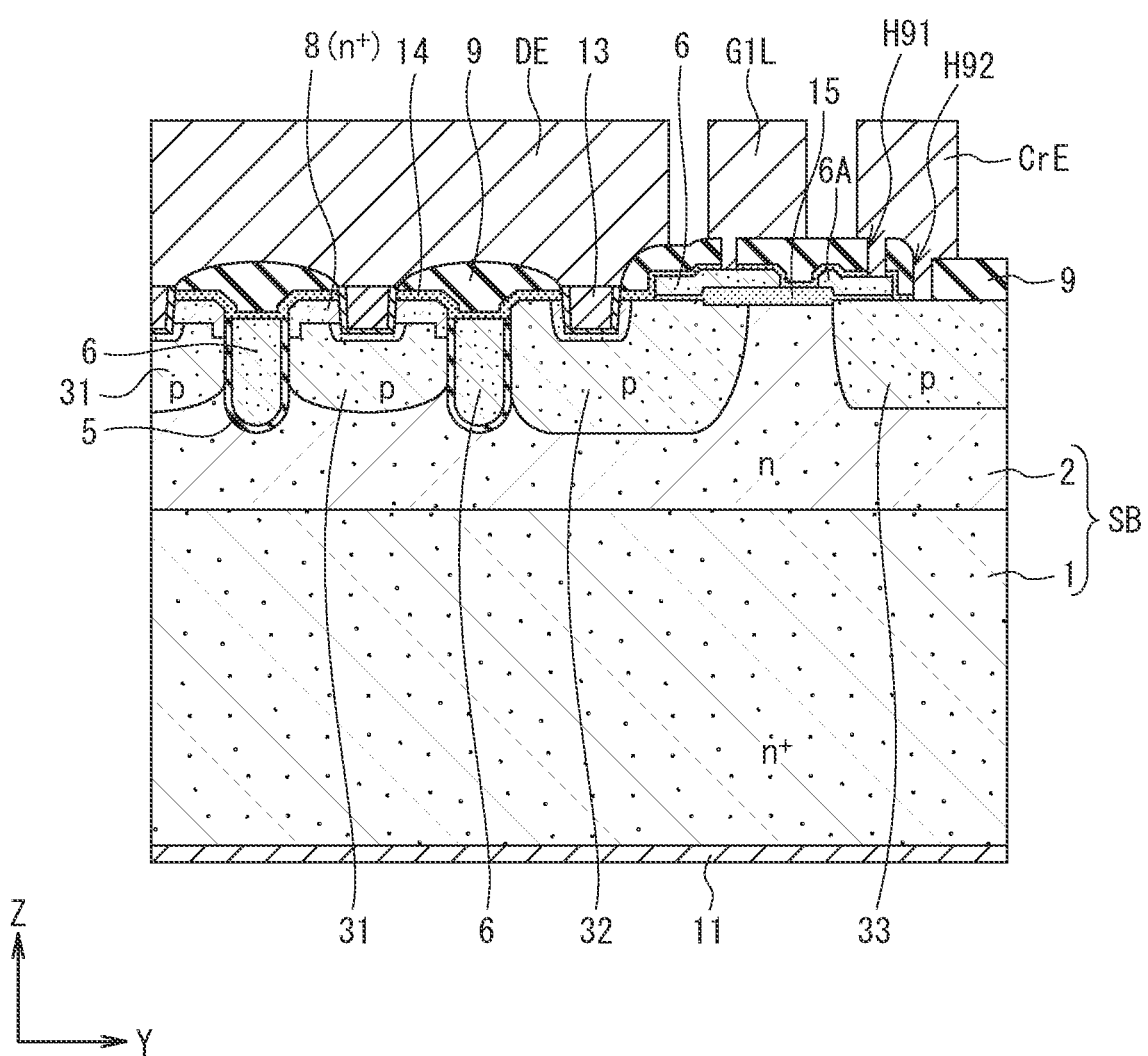
FIG. 10 is a cross-section view taken along line X-X' of FIG. 9.

FIG. 9 is a plan view illustrating a structural example of a corner portion of the semiconductor element according to the embodiment of the present invention. FIG. 9 illustrates, in an enlarged manner, a region AR11 surrounded by a broken line in the first region AR1 illustrated in FIG. 2. The region AR11 is a region including the corner portion of the first region AR1. FIG. 10 is a cross-sectional view taken along line X-X' of FIG. 9. As illustrated in FIG. and FIG. 10, the corner portion of the first region AR1 is provided with the channel stopper region 33, the gate electrode 6, the field plate 6A, the interlayer insulating film 9, and a corner electrode CrE. In the corner portion, the gate electrode 6 is drawn out onto the semiconductor layer 2. The interlayer insulating film 9 covers the gate electrode 6 drawn out onto the semiconductor layer 2 and the field plate 6A. Additionally, the corner electrode CrE is provided on the interlayer insulating film 9. Note that FIG. 9 and FIG. 10 do not illustrate the protecting film 60 illustrated in FIG. 23.

The interlayer insulating film 9 is provided with through holes H91 and H92. The corner electrode CrE is electrically connected to the field plate 6A through the through hole H91, and is electrically connected to the channel stopper region 33 through the through hole H92. As a result, the field plate 6A and the channel stopper region 33 are electrically connected to each other via the corner electrode CrE. Additionally, side faces of an outer peripheral portion of the semiconductor element 50 are end faces subjected to dicing, where crystal structure has been destroyed. Due to that, at the side face of the outer peripheral portion of the semiconductor element 50, the channel stopper region 33 and the first semiconductor region 21 are conducted to each other. As a result, the field plate 6A, the corner electrode CrE, the channel stopper region 33 positioned at the outer peripheral portion (including the corner portion) of the semiconductor element 50, the first semiconductor region 21, and the second semiconductor region 22 are put at floating potential.

At the corner portion, wires and the like are not arranged in a region positioned further outside than the first gate wire G1L (or the second gate wire G2L), so that the region is usually a dead space that is not utilized effectively. In the present embodiment, the corner electrode CrE is arranged in the dead space to effectively utilize the region that is usually the dead space. This enables downsizing of the semiconductor element 50.

Figure 11:
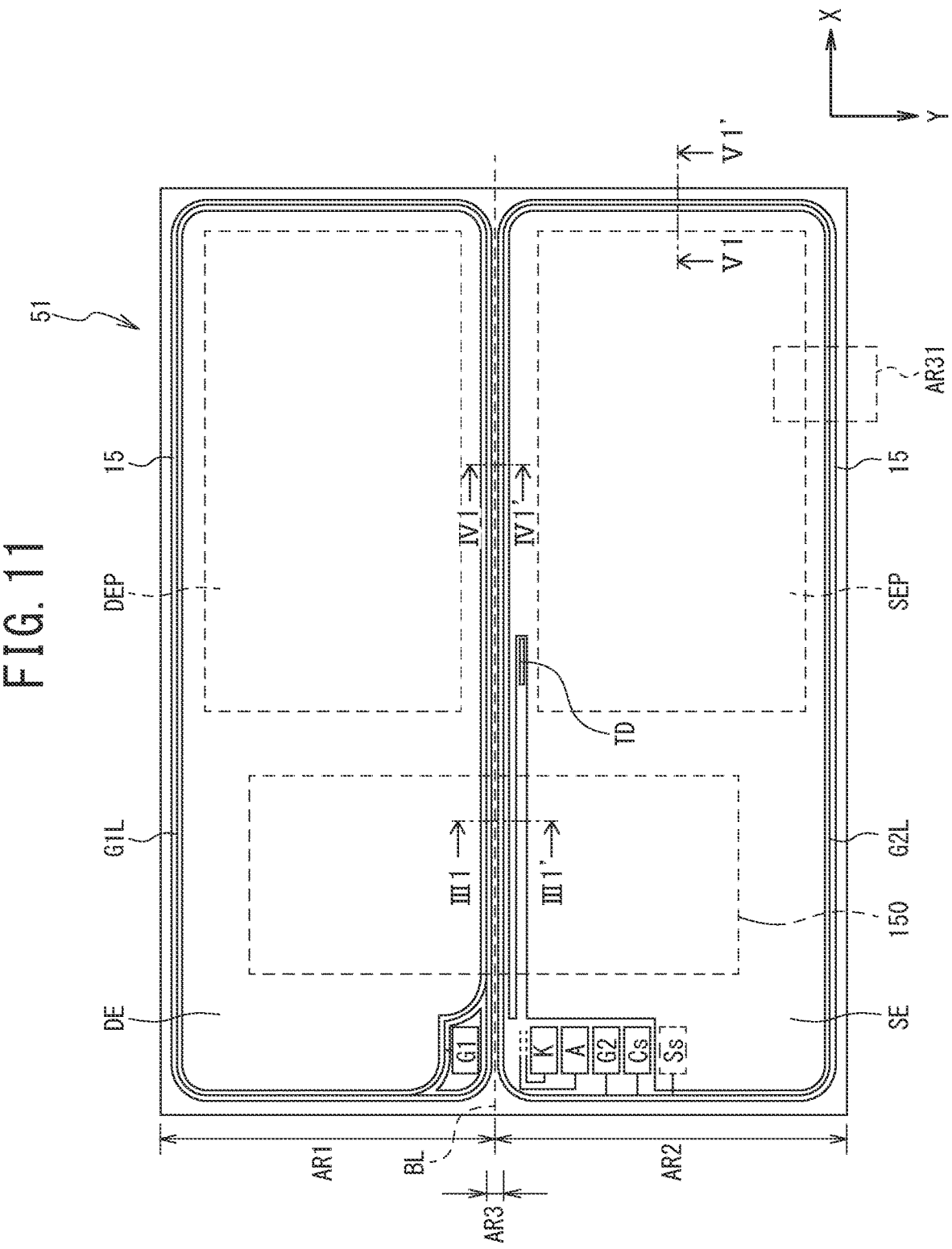
FIG. 11 is a plan view illustrating another structural example of the semiconductor element according to the embodiment of the present invention.
Figure 12:
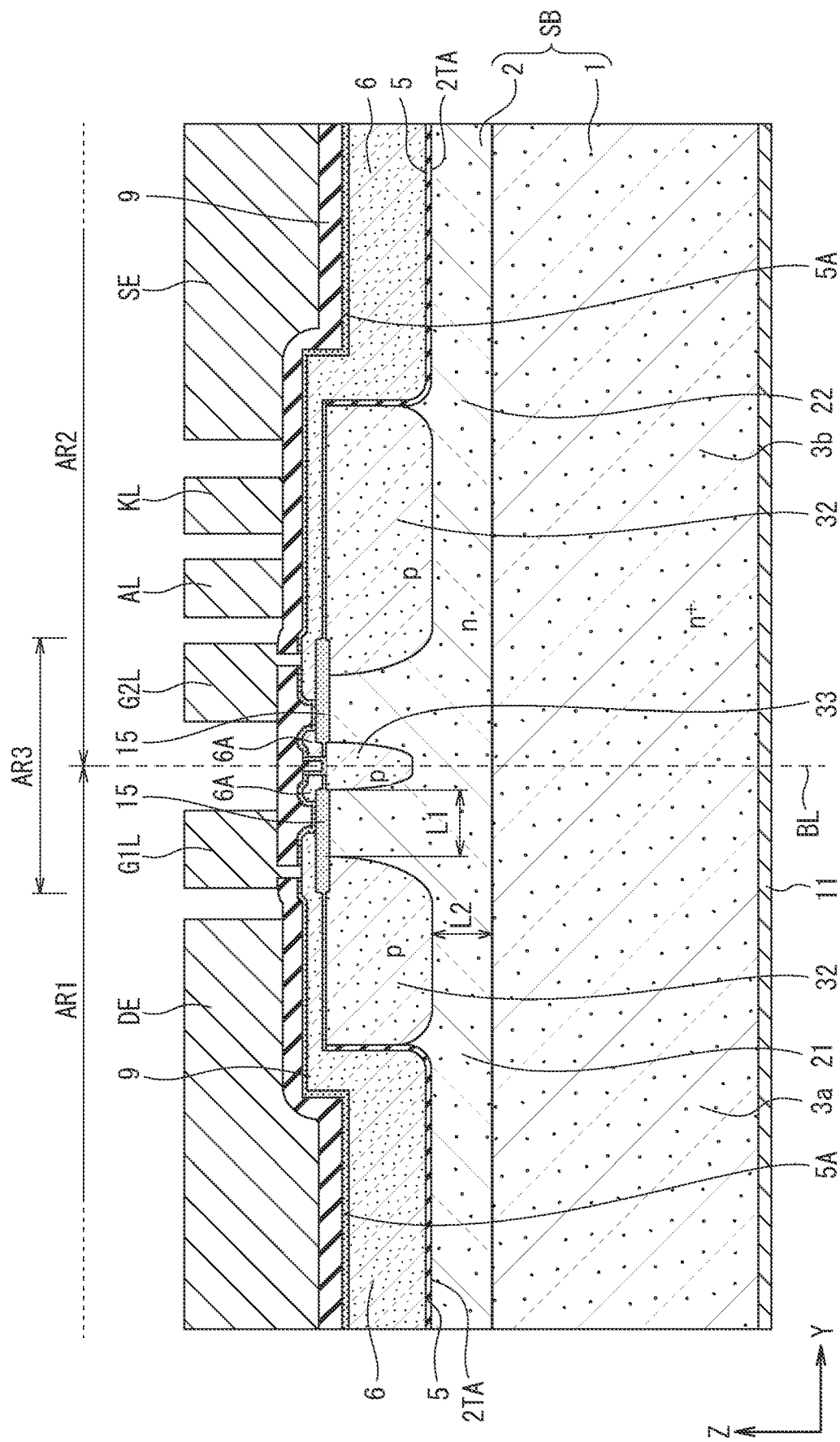
FIG. 12 is a cross-sectional view taken along line III1-III1' of the plan view illustrated in FIG. 11.
Figure 13:
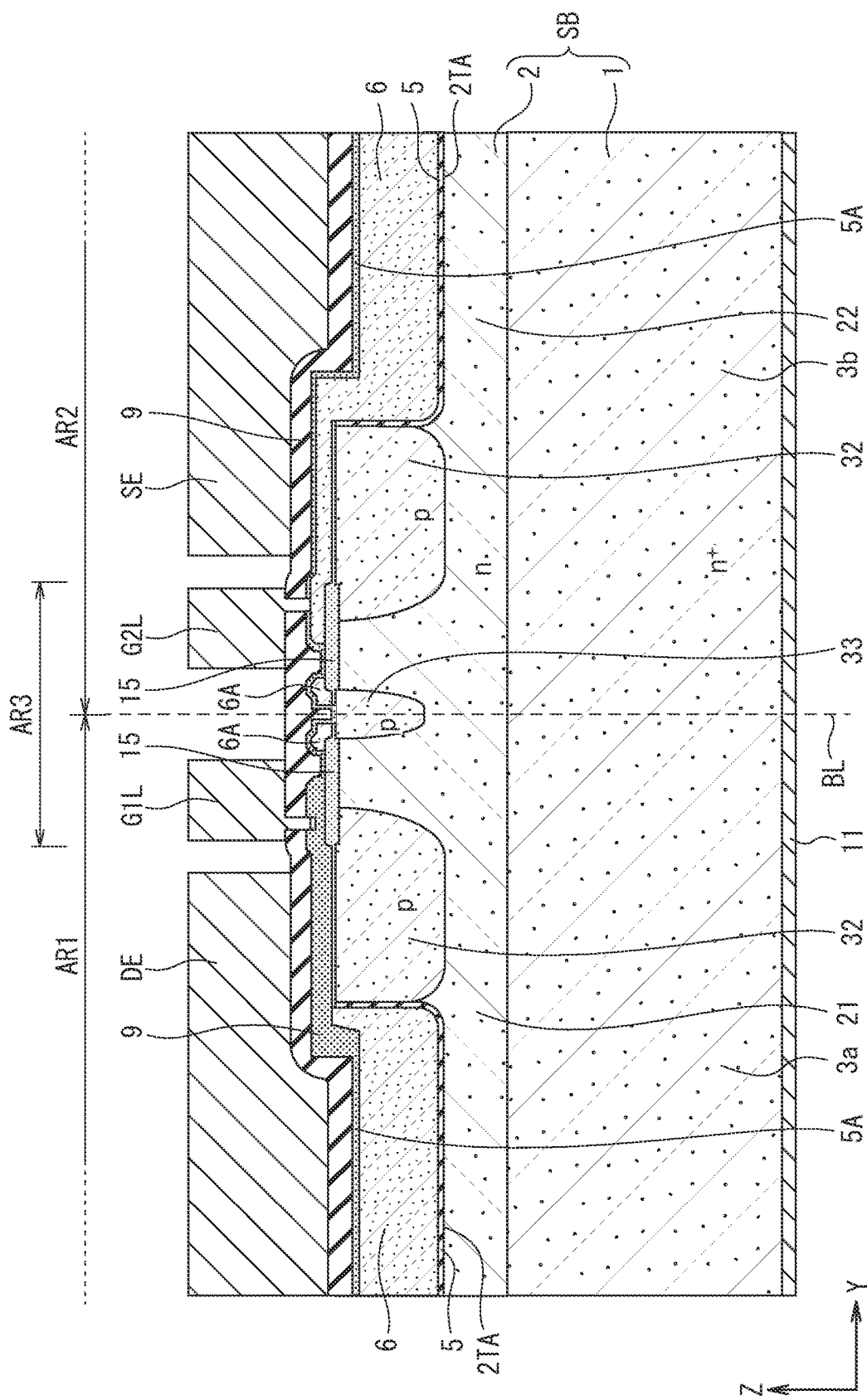
FIG. 13 is a cross-sectional view taken along line IV1-IV1' of the plan view illustrated in FIG. 11.
Figure 14:
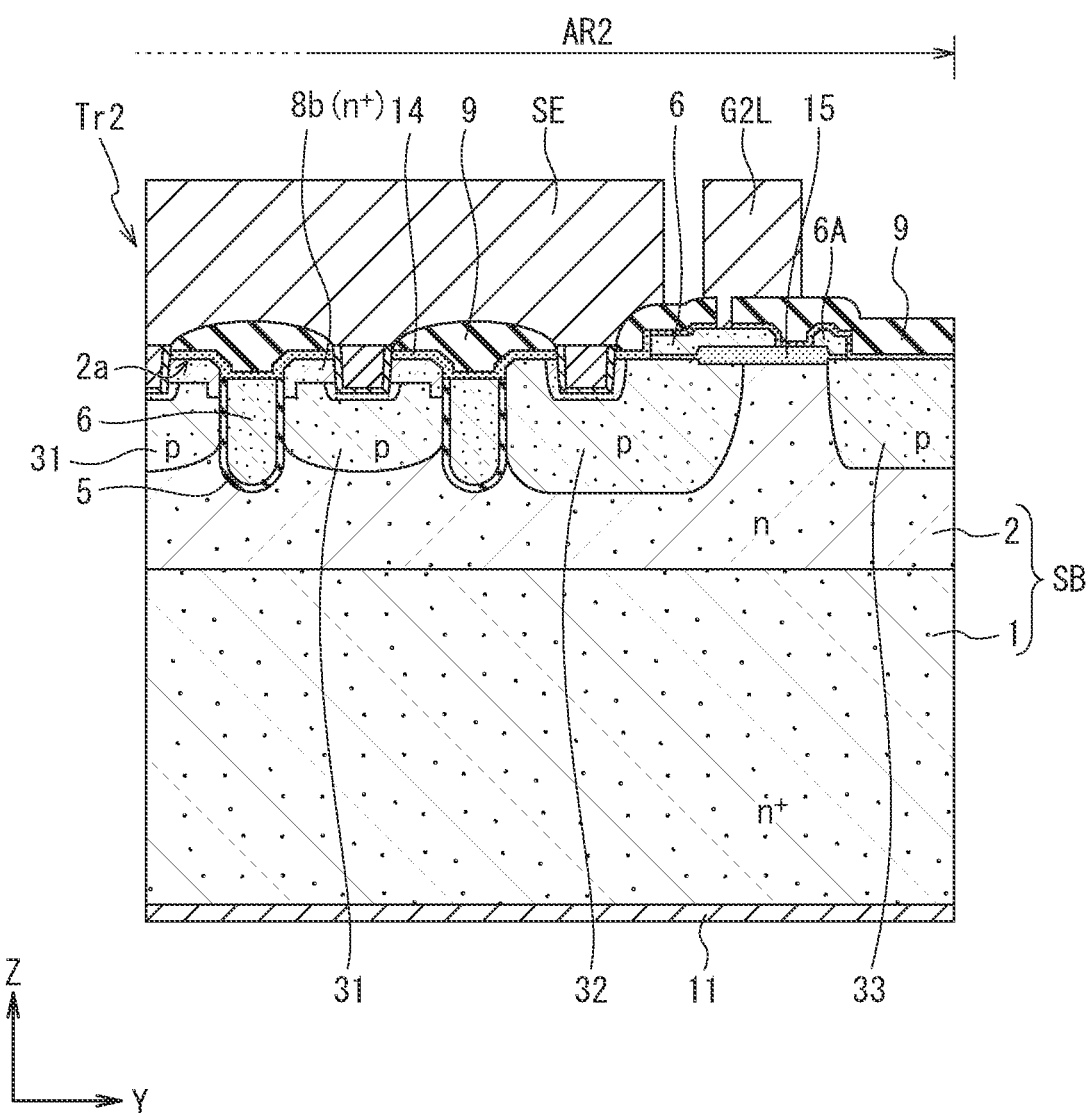
FIG. 14 is a cross-sectional view taken along line V1-V1' of the plan view illustrated in FIG. 11.
Figure 15:
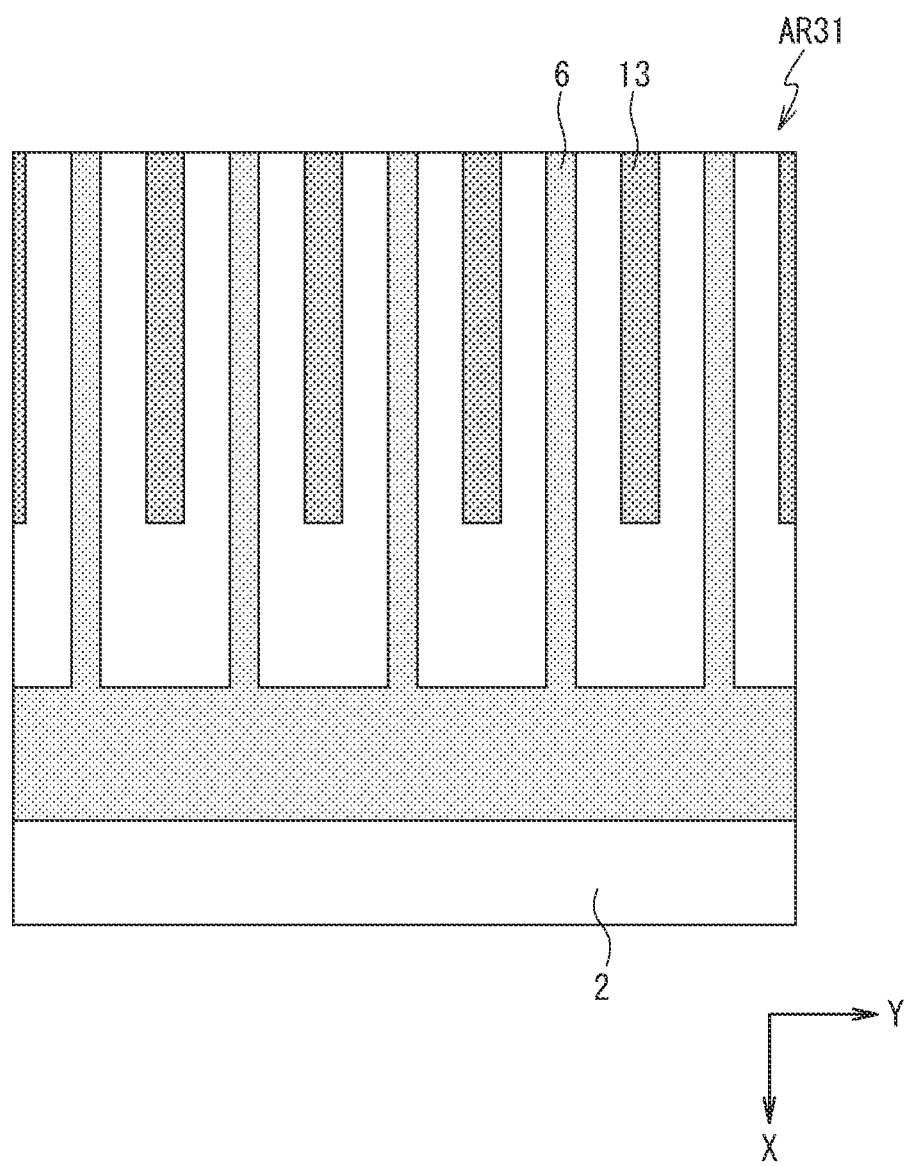
FIG. 15 is a plan view illustrating a structural example of the vicinity of an outer peripheral portion in an active region of the other structural example of the semiconductor element according to the embodiment of the present invention.

FIG. 11 is a plan view illustrating another structural example of the semiconductor element according to the embodiment of the present invention. In FIG. 11, the first gate wire G1L and the second gate wire G2L, respectively, are indicated by lines FIG. 12 is a cross-sectional view taken along line III1-III1' of the plan view illustrated in FIG. 11. FIG. 12 illustrates a cross-section of a portion including the anode wire AL and the cathode wire KL electrically connected to the temperature detecting element TD. FIG. 13 is a cross-sectional view taken along line IV1-IV1' of the plan view illustrated in FIG. 11. FIG. 13 illustrates a cross-section of a portion not including the temperature detecting element TD. FIG. 14 is a cross-sectional view taken along line V1-V1' of the plan view illustrated in FIG. 11. FIG. 14 is a cross-section of a linear region parallel to the K axis direction in an outer peripheral portion of the second region AR2. Note that FIG. 11 to FIG. 15 do not illustrate the protecting film 60 illustrated in FIG. 23. FIG. 15 is a plan view illustrating a structural example of the vicinity of an outer peripheral portion in an active region of the other structural example of the semiconductor element. FIG. 15 illustrates, in an enlarged manner, a region AR31 surrounded by a broken line in the second region AR2 illustrated in FIG. 11, while omitting the interlayer insulating film 9, the source electrode SE, and the protecting film 60 illustrated in FIG. 23. The region AR31 includes the active region of the second region AR2 and the outer peripheral portion thereof.

A semiconductor element 51 is different from the semiconductor element 50 illustrated in FIG. 2 to FIG. 5 in terms of the direction in which the gate electrode 6 extends.

While the gate electrode 6 of the semiconductor element 50 is arranged such that a longitudinal direction thereof is parallel to the X axis direction, the gate electrode 6 of the semiconductor element 51 is arranged such that the longitudinal direction thereof is parallel to the Y axis direction traversing the first region AR1 and the second region AR2.

By arranging the gate electrode 6 such that the longitudinal direction thereof is parallel to the Y axis direction, a current flowing direction coincides with a region where a channel is formed in the first MOS transistor Tr1 and the second MOS transistor Tr2, thus facilitating current flow. This can improve ON-resistance characteristics.

Note that the structure and advantageous effects of the semiconductor element 51 are the same as those of the semiconductor element 50.

For example, the distance L1 between the resurf region 32 and the channel stopper region 33 adjacent to each other illustrated in FIG. 12 is sufficiently longer than the distance L2 between the resurf region 32 and the support substrate 1. For example, while the distance L2 is several μm, the distance L1 is several tens of μm. Specifically, while the distance L2 is from 2 μm to 10 μm, the distance L1 is from 20 μm to 60 μm. It suffices that the distance L1 is 5 times or more than the distance L2.

In addition, as illustrated in FIG. 14, in the first region AR1, the well region 31 is formed to be shallower than the trench 2TA, whereas the resurf region 32 is formed to be deeper than the trench 2TA. As a result, electric field intensity at the bottom of the terminal end portion of the trench 2TA can be reduced as compared with the case where the resurf region 32 is formed to have the same depth as that of the well region 31, thereby enabling a depletion layer to be more widely extend in both horizontal and depthwise directions. Note that the same applies also to the second region AR2. As a result, breakdown voltage can be further increased in the outer peripheral portion of the first region AR1, the outer peripheral portion of the second region AR2, and the boundary portion AR3.

Figure 16:
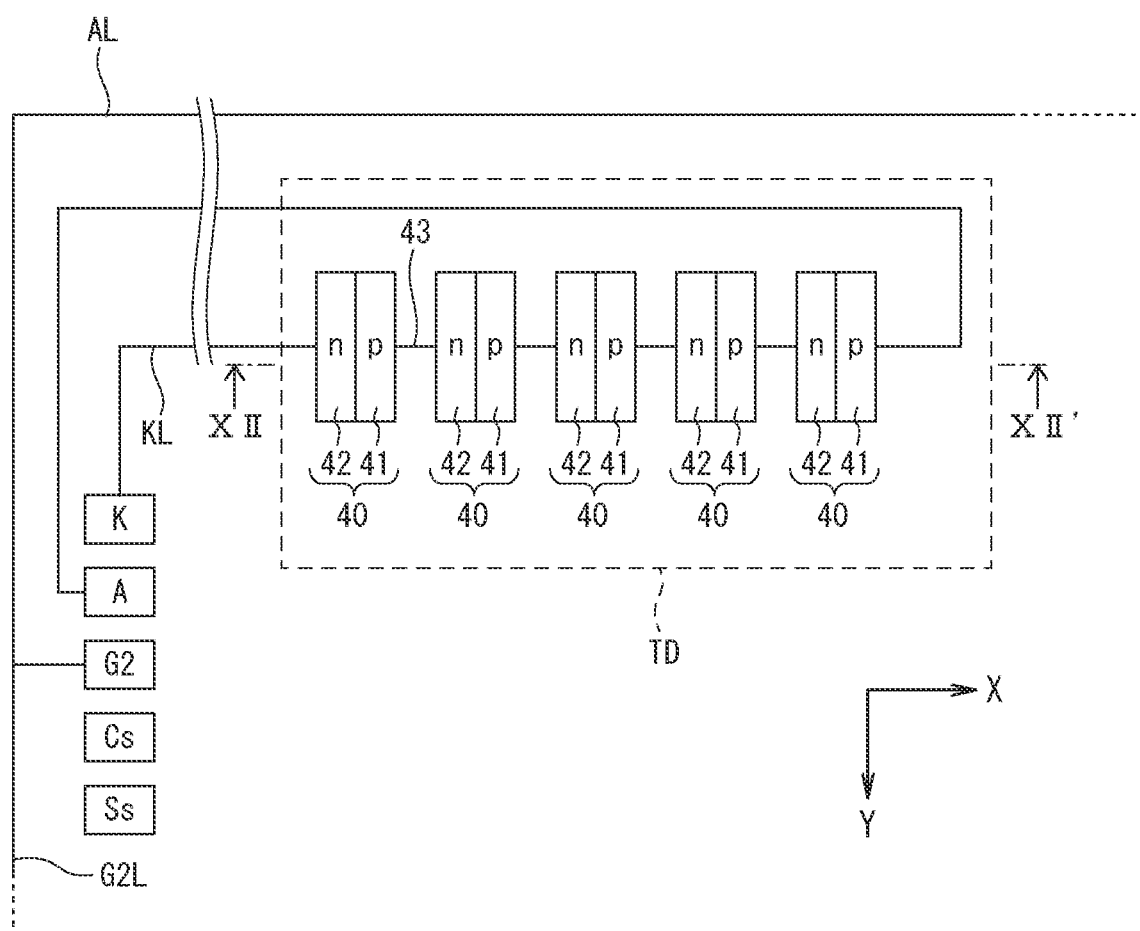
FIG. 16 is a plan view illustrating a structural example of a temperature detecting element according to an embodiment of the present invention.
Figure 17:
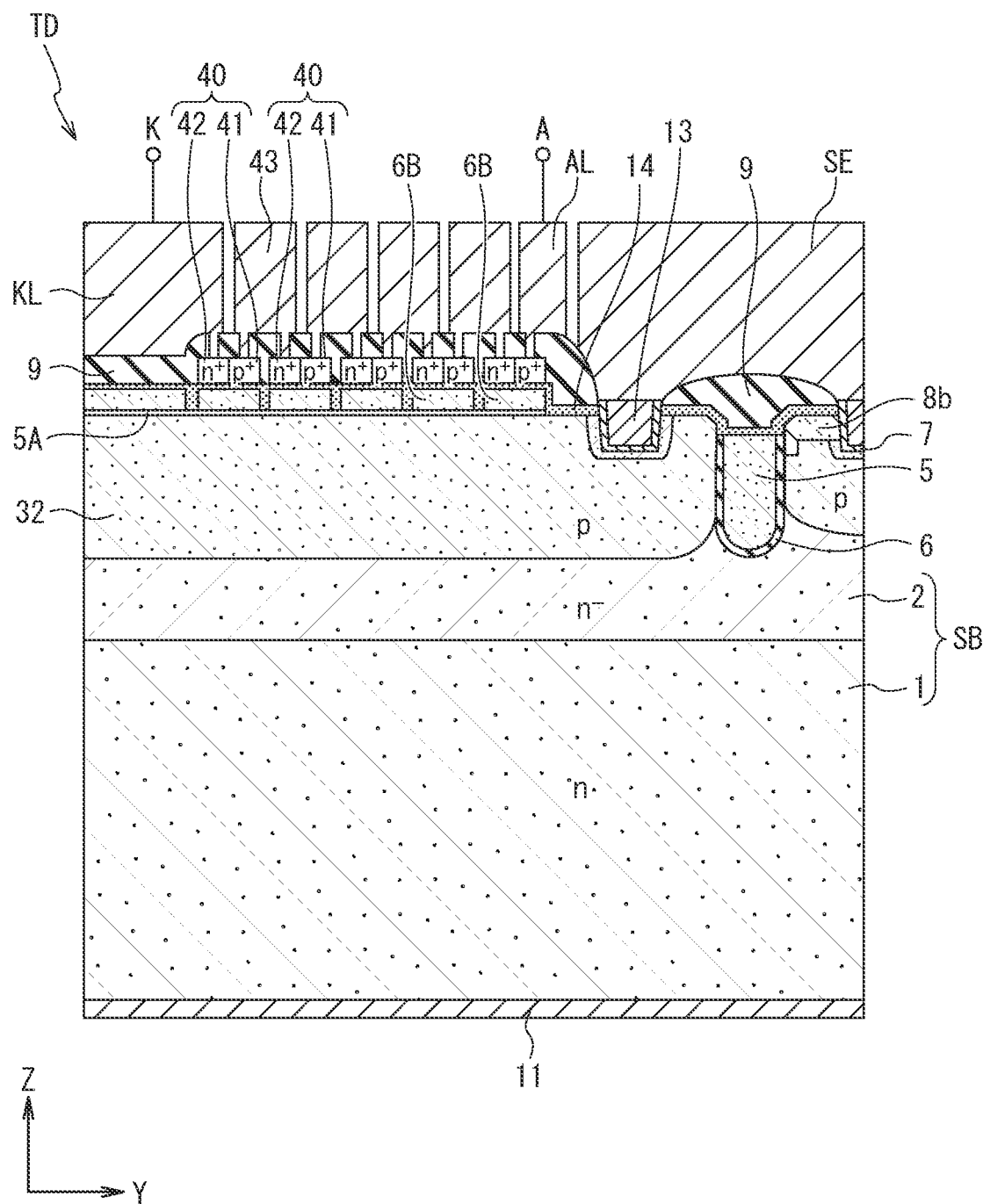
FIG. 17 is a cross-sectional view illustrating the structural example of the temperature detecting element according to the embodiment of the present invention.

FIG. 16 is a plan view illustrating a structural example of a temperature detecting element according to an embodiment of the present invention. FIG. 17 is a cross-sectional view of the structural example of the temperature detecting element according to the embodiment of the present invention. FIG. 17 corresponds to a cross-section taken along line XII-XII' of the plan view illustrated in FIG. 16. As illustrated in FIG. 16 and FIG. 17, the temperature detecting element TD has a structure in which a plurality of p-n junction diodes is connected in series. For example, the temperature detecting element TD includes a plurality of p-type semiconductor layers 41 and a plurality of n-type semiconductor layers 42. A pair of a p-type semiconductor layer 41 and an n-type semiconductor layer 42 joined together forms a single p-n junction diode 40. Note that FIG. 16 and FIG. 17 do not illustrate the protecting film 60 illustrated in FIG. 23. In addition, FIG. 17 illustrates a cross-sectional view in a case where the semiconductor element 51 illustrated in FIG. 11 to FIG. 15 includes the temperature detecting element TD.

Additionally, the p-n junction diodes 40 adjacent to each other are connected to each other via a relay electrode 43. For example, in the adjacent two p-n junction diodes 40, the p-type semiconductor layer 41 of one of the p-n junction diodes 40 is electrically connected to the n-type semiconductor layer 42 of the other p-n junction diode 40 via the relay electrode 43. As a result, the plurality of p-n junction diodes 40 is connected in series to form the temperature detecting element TD. An anode-side end portion of the temperature detecting element TD is electrically connected to the anode electrode pad A via the anode wire AL. A cathode-side end portion of the temperature detecting element TD is electrically connected to the cathode electrode pad K via the cathode wire KL.

As illustrated in FIG. 17, an insulating film 5A, the insulating film 14, and a semiconductor film 6B are provided between the p-n junction diodes 40 forming the temperature detecting element TD and the p-type resurf region 32. The insulating film 5A is provided on the resurf region 32. The semiconductor film 6B is provided on the insulating film 5A. Additionally, the insulating film 14 covers an upper surface and side faces of the semiconductor film 6B. For example, the insulating film 5A is simultaneously formed together with the gate insulating film 5 in the same step. The insulating film 5A is an film. The semiconductor film 6B is simultaneously formed together with the gate electrode 6 in the same step. The semiconductor film 6B is polysilicon doped with an impurity such as phosphorus. The semiconductor film 6B is not electrically connected to anywhere, and thus is at floating potential.

The semiconductor film 6B is provided to prevent surge of the temperature detecting element TD. The semiconductor film 6B has a thickness of, for example, from 200 nm to 1000 nm. Not only is the insulating film 14 provided under the p-n junction diodes 40, but also the insulating film 5A is provided under the semiconductor film 6B that is a thick film, thereby further enhancing insulation characteristics between the p-n junction diodes 40 and the resurf region 32. Additionally, the resurf region 32 positioned below the temperature detecting element TD is electrically connected to the source electrode SE. The resurf region 32 is fixed at a source potential (for example, 0 V), which thus can prevent an unintended bias from being applied to the p-n junction diodes 40 from the well region 31. This can prevent fluctuation of characteristics of the temperature detecting element TD due to the bias from the surrounding. Thus, variation in temperature detection accuracy is reduced.

Figure 18:
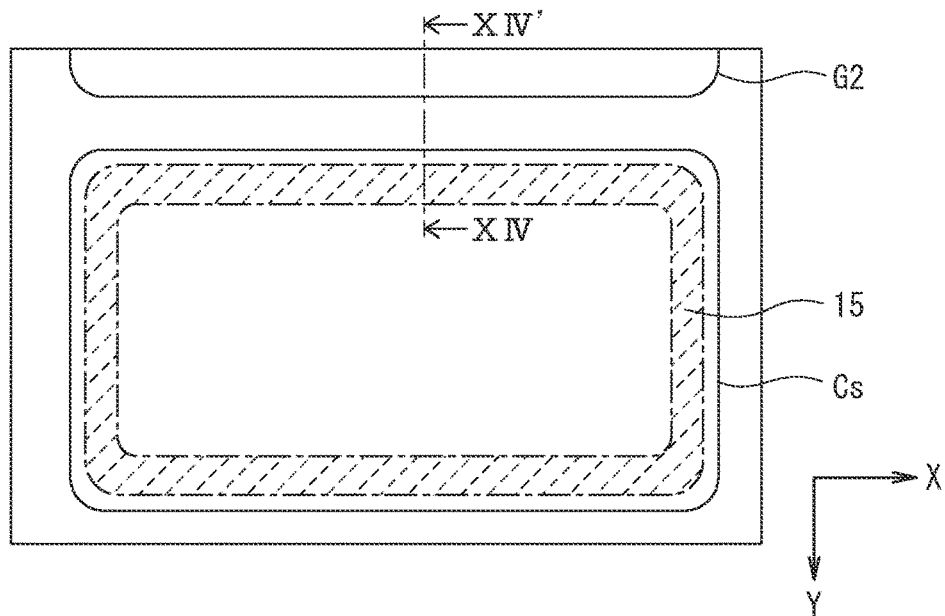
FIG. 18 is a plan view illustrating a structural example of a current detecting electrode pad Cs according to an embodiment of the present invention and a vicinity thereof.
Figure 19:
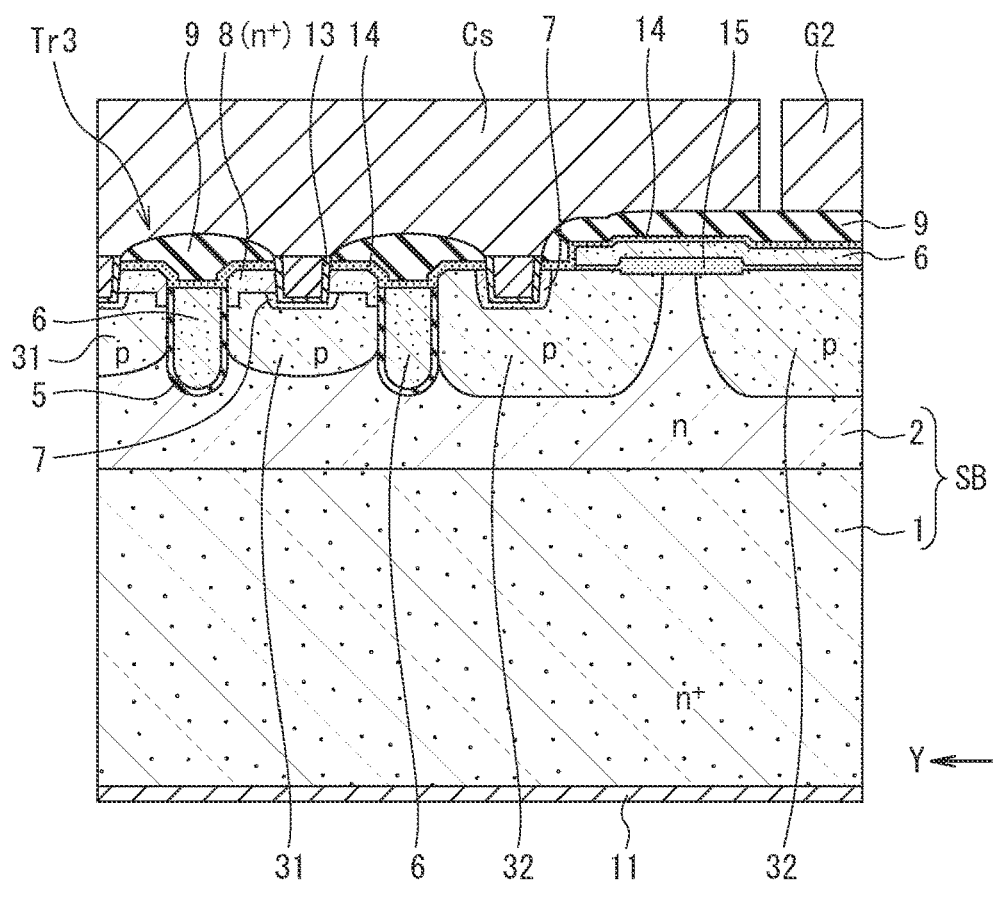
FIG. 19 is a cross-sectional view illustrating the structural example of the current detecting electrode pad Cs according to the embodiment of the present invention and the vicinity thereof.

FIG. 18 is a plan view illustrating a structural example of the current detecting electrode pad Cs according to an embodiment of the present invention and the vicinity thereof. FIG. 19 is a cross-sectional view illustrating the structural example of the current detecting electrode pad Cs according to the embodiment of the present invention and the vicinity thereof. FIG. 19 illustrates a cross-section taken along line XIV-XIV' of FIG. 18. Note that FIG. 18 and FIG. 19 do not illustrate the protecting film 60 illustrated in FIG. 23. As illustrated in FIG. 18 and FIG. 19, a plurality of third MOS transistors Tr3 is provided in a region immediately under the current detecting electrode pad Cs. The third MOS transistors TR3 are the same in structure as each of the first MOS transistor Tr1 and the second MOS transistor Tr2. The third MOS transistors Tr3 are simultaneously formed together with the first MOS transistor Tr1 and the second MOS transistor Tr2 in the same step. The third MOS transistors Tr3 electrically connected to the current detecting electrode pad Cs are each separated from the active region of the first region AR1 and the active region of the second region AR2. For example, as illustrated in FIG. 19, the perimeters of the third MOS transistors Tr3 electrically connected to the current detecting electrode pad Cs are surrounded by the LOCOS film 15. For example, an area occupied by the third MOS transistors Tr3 is $1/10000$ of an area occupied by the second MOS transistor Tr2 (i.e., an area of the active region of the second region AR2).

Additionally, to set a ratio between the area occupied by the third MOS transistors Tr3 and the area occupied by the second MOS transistor Tr2 (the area of the active region of the second region AR2) to a desired ratio, a portion provided with the source region 8 in the third MOS transistors Tr3 illustrated in FIG. 19 may be reduced to make small the area of the active region of the third MOS transistors Tr3.

Note that the current detecting electrode pad Cs and the third MOS transistors Tr3 illustrated in FIG. 18 and FIG. 19 may have the same structure whether used in the semiconductor element 50 illustrated in FIG. 2 to FIG. 6 or the semiconductor element 51 illustrated in FIG. 11 to FIG. 15.

Structure of Semiconductor Device

Figure 20:
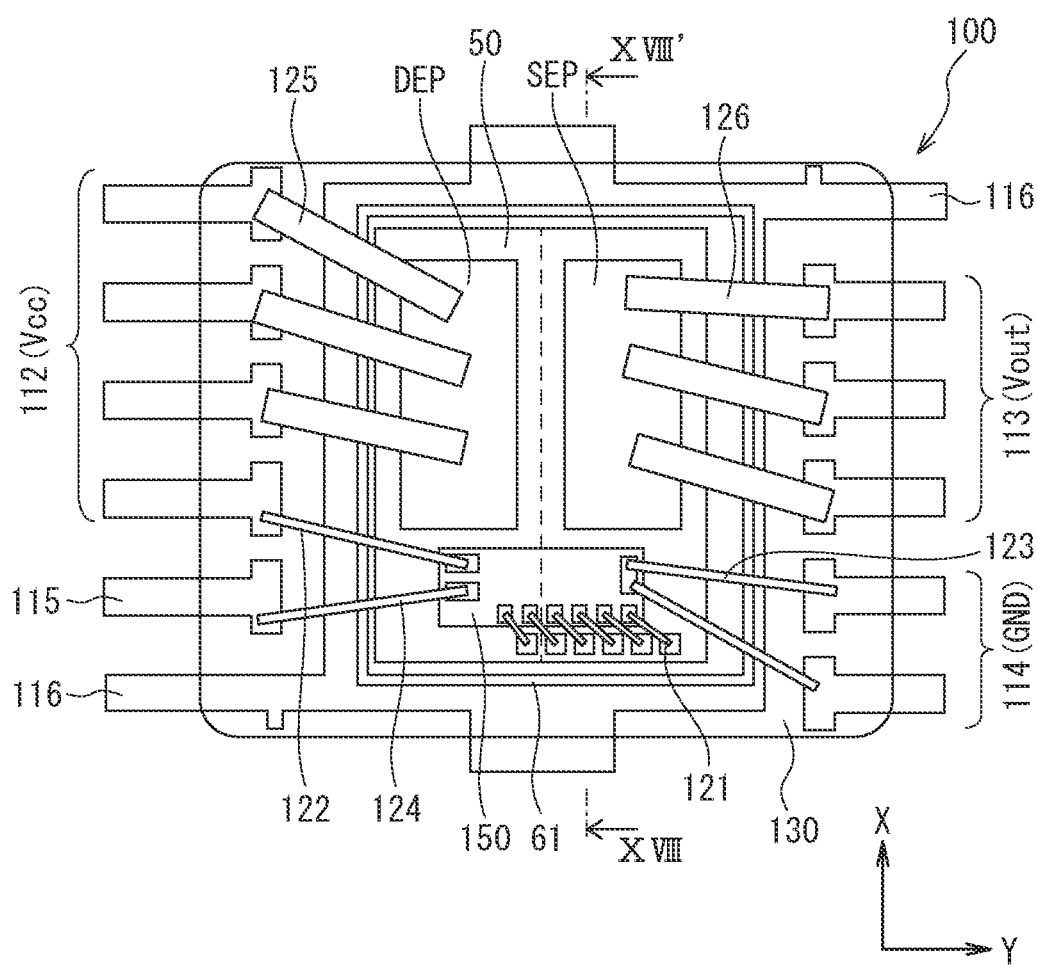
FIG. 20 is a plan view illustrating a structural example of the semiconductor device according to the embodiment of the present invention.

FIG. 20 is a plan view illustrating a structural example of the semiconductor device according to the embodiment of the present invention. In FIG. 20, an inside of the semiconductor device 100 is illustrated by seeing through a resin package 130.

Figure 22:
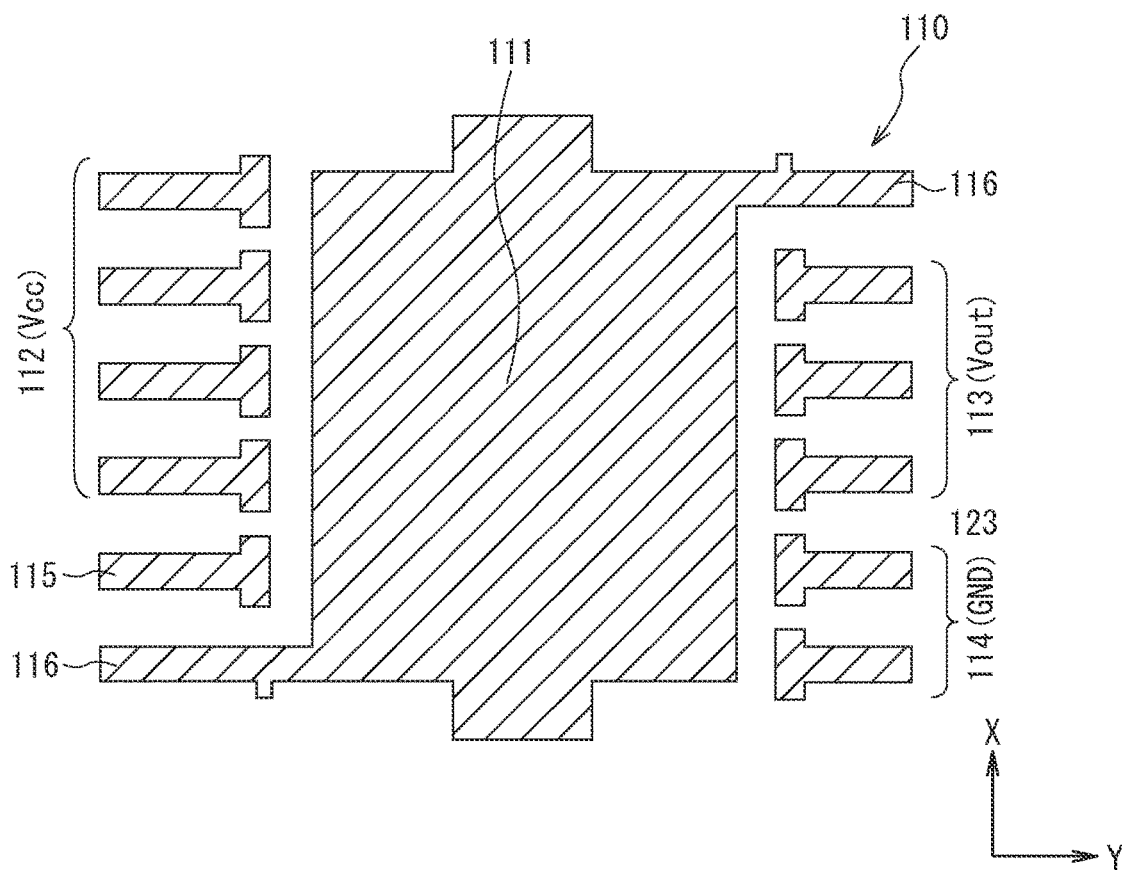
FIG. 22 is a plan view illustrating a lead frame according to an embodiment of the present invention.
Figure 23:
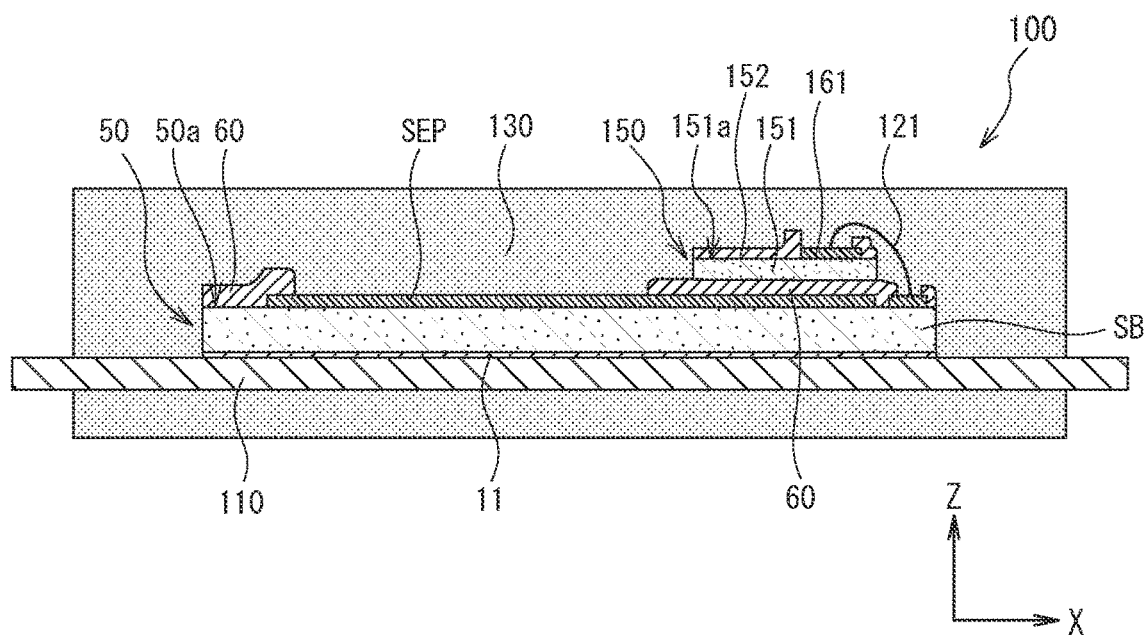
FIG. 23 is a cross-sectional view illustrating the structural example of the semiconductor device according to the embodiment of the present invention.

FIG. 21 is a plan view illustrating the semiconductor element according to the embodiment of the present invention and a control element in an enlarged manner. FIG. 22 is a plan view illustrating a lead frame according to an embodiment of the present invention. FIG. 23 is a cross-sectional view illustrating the structural example of the semiconductor device according to the embodiment of the present invention. FIG. 23 illustrates a cross-section taken along line XVIII-XVIII' of the plan view illustrated in FIG. 20.

As illustrated in FIG. 20, FIG. 21, and FIG. 23, the semiconductor device 100 according to the embodiment of the present invention includes the lead frame 110, the semiconductor element 50 mounted on the lead frame 110, a control element 150 stacked on the semiconductor element 50, conductive wires 121 to 126, and the resin package 130.

The control element 150 is an integrated circuit (IC) chip. The control element 150 includes a substrate 151, a plurality of electrode pads 161 to 165 formed on one surface (for example, an upper surface 151a) of the substrate 151, and an insulative protecting film 152 provided on the upper surface 151a of the substrate 151. The substrate 151 is provided with a control circuit. The electrode pads 161 to 165 are electrodes exposed on a front surface of the control element 150. The protecting film 152 is provided with opening portions. Each of the plurality of electrode pads 161 to 165 is exposed from the opening portions of the protecting film 152.

As illustrated in FIG. 23, the semiconductor element 50 includes the insulative protecting film 60 covering one surface (for example, a front surface) 50a thereof. The protecting film 60 is provided with opening portions. Portions exposed from the opening portion of the protecting film 60 are the drain electrode pad DEP, the source electrode pad SEP, the first gate electrode pad G1, the second gate electrode pad G2, the cathode electrode pad K, the anode electrode pad A, the current detecting electrode pad Cs, and the potential detecting electrode pad Ss.

The control element 150 is attached to the protecting film 60 covering the front surface 50a of the semiconductor element 50 via an insulative adhesive agent. The insulative adhesive agent may be sheet-shaped. The control element 150 and the semiconductor element 50 are fixed by the insulative adhesive agent.

As illustrated in FIG. 21, the control element 150 is arranged in such a manner as to straddle the boundary BL between the first region AR1 and the second region AR2 of the semiconductor element 50 in a planar view. An electrode pad group of the semiconductor element 50 (the first gate electrode pad G1, the second gate electrode pad G2, the cathode electrode pad K, the anode electrode pad A, the current detecting electrode pad Cs, and the potential detecting electrode pad Ss) are placed at the outer peripheral portion of the semiconductor element 50, and arranged side by side in the Y axis direction. The control element 150 is arranged in a region sandwiched by the drain electrode pad DEP and the source electrode pad SEP and the above electrode pad group in a planar view.

As illustrated in FIG. 22, the lead frame 110 includes an island 111 and lead terminals 112 to 116 arranged near the island 111. For example, a power supply voltage Vcc is input to each lead terminal 112. Voltage is output to each lead terminal 113 from the semiconductor element 50. Each lead terminal 114 is connected to a fixed potential (for example, a ground potential). A signal Sig to the control element 150 is input to the lead terminal 115. Each lead terminal 116 is connected to the island 111.

The semiconductor element 50 is mounted on the island 111. For example, as illustrated in FIG. 20, a conductive adhesive agent 61 is provided between the island 111 and the back surface 1b of the support substrate 1. The conductive adhesive agent 61 is, for example, solder or silver paste. Additionally, the conductive adhesive agent 61 may be sheet-shaped. The lead terminals 116 are connected to the back surface 1b of the support substrate 1 via the island 111 and the adhesive agent 61.

As illustrated in FIG. 21, the electrode pad 161 of the control element 150 includes six electrode pads 161A to 161F. The electrode pad 161A of the control element 150 is connected to the first gate electrode pad G1 of the semiconductor element 50 via a wire 121. The electrode pad 161B of the control element 150 is connected to the cathode electrode pad K of the semiconductor element 50 via the wire 121. The electrode pad 161C of the control element 150 is connected to the anode electrode pad A of the semiconductor element 50 via the wire 121. The electrode pad 161D of the control element 150 is connected to the second gate electrode pad G2 of the semiconductor element 50 via the wire 121. The electrode pad 161E of the control element 150 is connected to the current detecting electrode pad Cs of the semiconductor element 50 via the wire 121. The electrode pad 161F of the control element 150 is connected to the potential detecting electrode pad Ss of the semiconductor element 50 via the wire 121. The electrode pads 161A to 161F each connected to the semiconductor element 50 via the wire 121 are arranged on a side of the control element 150 close to an outer peripheral portion of the semiconductor element 50.

In addition, the electrode pad 162 of the control element 150 is connected to the lead terminal 112 of the lead frame 110 via a wire 122. The electrode pad 163 of the control element 150 is connected to each lead terminal 114 of the lead frame 110 via a wire 123. The electrode pad 164 of the control element 150 is connected to the lead terminal 115 of the lead frame 110 via a wire 124.

The drain electrode pad DEP of the semiconductor element 50 is connected to each lead terminal 112 of the lead frame 110 via a wire 125. The source electrode pad SEP of the semiconductor element 50 is connected to each lead terminal 113 of the lead frame 110 via a wire 126.

As illustrated in FIG. 21, the planar shape of the semiconductor element 50 is, for example, rectangular. Additionally, in the control element 150, a portion PA1 arranged on the first region AR1 of the semiconductor element 50 and a portion PA2 arranged on the second region AR2 of the semiconductor element 50 have an equal area in a planar view. As a result, the drain electrode pad DEP provided in the first region AR1 and the source electrode pad SEP provided in the second region AR2 can easily have the same or substantially the same area.

Current concentrates at joint portions between the drain electrode pad DEP and the wire 125 and joint portions between the source electrode pad SEP and the wire 126. Thus, the joint portions tend to have the highest temperature in the semiconductor device 100. Thus, by setting such that the drain electrode pad DEP and the source electrode pad SEP have substantially the same area, the wires 125 and 126 connected to the drain electrode pad DEP and the source electrode pad SEP can be connected to similar positions. This allows current to be uniformly flown in the drain electrode pad DEP and the source electrode pad SEP.

Additionally, current flows through the drain electrode DE from the wire 125, next through a first drift region 25 and then a second drift region 26, and from the source electrode SE to the wire 126. As a result, current tends to concentrate between the drain electrode pad DEP and the source electrode pad SEP.

Due to this, the control element 150 is arranged at a position away from between the drain electrode pad DEP and the source electrode pad SEP. By doing this, temperature rise in the control element 150 is suppressed.

Note that while the semiconductor device 100 includes the lead frame 110, the semiconductor element 50 mounted on the lead frame 110, the control element 150 stacked on the semiconductor element 50, the conductive wires 121 to 126, and the resin package 130, the same advantageous effect can be obtained even by replacing the semiconductor element 50 with the semiconductor element 51 illustrated in FIG. 11 to FIG. 15.

AS described hereinabove, the semiconductor element 50 according to the embodiment of the present invention includes the semiconductor substrate SB including the first region AR1 and the second region AR2 adjacent to each other, the first transistor (for example, the first MOS transistor Tr1) provided in the first region AR1, the second transistor (for example, the second MOS transistor Tr2) provided in the second region AR2, and the temperature detecting element TD provided on the semiconductor substrate SB.

The first MOS transistor Tr1 includes the first source region 8a of the first conductivity type (for example, n-type) (the source region 8 positioned in the first region AR1), the n-type first semiconductor region 21 arranged away from the first source region 8a, and the first well region of the second conductivity type (for example, p-type) (for example, the well region 31 positioned in the first region AR1) arranged between the first source region 8a and the first semiconductor region 21. The second MOS transistor Tr2 includes the n-type second source region 8b (the source region 8 positioned in the second region AR2), the n-type second semiconductor region 22 arranged away from the second source region 8b, the p-type second well region (for example, the well region 31 positioned in the second region AR2) arranged between the second source region 8b and the second semiconductor region 22. The first semiconductor region 21 is connected to the second semiconductor region 22. The expression "the first semiconductor region 21 is connected to the second semiconductor region 22" means that the first and second semiconductor regions 21 and 22 are electrically connected to each other, i.e., are in a conduction state. For example, the first drain region 3a that is the support substrate 1 positioned in the first region AR1 and the second drain region 3b that is the support substrate 1 positioned in the second region AR2 are integrated with each other, and furthermore, the first semiconductor region 21 arranged on the first drain region 3a is integrated (communized) with the second semiconductor region 22 arranged on the second drain region 3b.

As a result, the drain of the first MOS transistor Tr1 is connected to the drain of the second MOS transistor Tr2, as illustrated in FIG. 1. For example, the drain of the first MOS transistor Tr1 is integrated (commonized) with the drain of the second MOS transistor Tr2. The drain of the first MOS transistor Tr1 corresponds to the first drain region 3a positioned in the first region AR1 illustrated in FIG. 3, FIG. 4, FIG. 12, and FIG. 13. The well region 31 and the resurf region 32 arranged in the first semiconductor region 21 provided on the first drain region 3a are electrically connected to the drain electrode DE. The drain of the second MOS transistor Tr2 corresponds to the second drain region 3b positioned in the second region AR2 illustrated in FIG. 3, FIG. 4, FIG. 12, and FIG. 13. The well region 31 arranged in the second semiconductor region 22 provided on the second drain region 3b and the resurf region 32 arranged in the second semiconductor region 22 of the second drift region 26 are electrically connected to the source electrode SE of the second MOS transistor Tr2.

In addition, the cathode of the first body diode BD1 of the first MOS transistor Tr1 and the cathode of the second body diode BD2 of the second MOS transistor Tr2 are electrically connected to each other. This allows the first body diode BD1 and the second body diode BD2 to form a bidirectional high breakdown voltage structure.

In the semiconductor element 50, the first MOS transistor Tr1 and the second MOS transistor Tr2 are arranged side by side in the horizontal direction (for example, the X axis direction or the Y axis direction), and integrated as a single element. In this structure, current flowing through the semiconductor substrate SB tends to become nonuniform, whereby a current concentrated region and a current non-concentrated region tend to be formed. Furthermore, the current concentrated region tends to cause heat generation. However, the semiconductor element 50 includes the temperature detecting element TD. The temperature detecting element TD can detect the temperature of the semiconductor substrate SB, and output to the control element 150. On the basis of the detected temperature, the control element 150 can transmit a voltage signal for turning off the first MOS transistor Tr1 and the second MOS transistor Tr2 to the gates thereof. As a result, the semiconductor element 50 can reduce possibilities of malfunctions and breakdowns due to temperature rise.

Note that the semiconductor element 50 can use n-type MOS transistors as the first MOS transistor Tr1 and the second MOS transistor Tr2, respectively. This can achieve both reduction of ON-resistance and reduction of chip area. More specifically, the ON-resistance of a p-type MOS transistor is approximately three times that of an n-type MOS transistor. To reduce ON-resistance in an integrated circuit using p-type MOS transistors, it is necessary to increase the chip area, where there are problems such as increased production cost and increased packaging size. By contrast, the semiconductor element 50 can use n-type MOS transistors as the first MOS transistor Tr1 and the second MOS transistor Tr2, respectively. Thus, the semiconductor element 50 can achieve both the reduction of ON-resistance and the reduction of chip area, so that the above problems (increased production cost and increased packaging size) can be avoided.

Additionally, the semiconductor element 50 further includes the drain electrode DE provided in the first region AR1 and the source electrode SE provided in the second region AR2 and arranged away from the drain electrode DE. The drain electrode DE is electrically connected to the first source region 8a of the first MOS transistor Tr1. The source electrode SE is electrically connected to the second source region 8b of the second MOS transistor Tr2. Thus, when the power supply unit BT is normally connected to the load LCT, the first source region 8a of the first MOS transistor Tr1 serves as drain, and is at drain potential, and the second source region 8b of the second MOS transistor Tr2 serves as source, and is at source potential. The semiconductor element 50 allows current to flow through in the order of the first source region 8a of the first MOS transistor Tr1, the first semiconductor region 21, the first drain region 3a, the second semiconductor region 22, the second drain region 3b, and the second source region 8b of the second MOS transistor Tr2.

Note that, in the semiconductor element 50, the first drain region 3a and the first semiconductor region 21 arranged on the first drain region 3a serve as the drift region, and the second drain region 3b and the second semiconductor region 22 arranged on the second drain region 3b serve as the drift region.

However, since current flows through a path with low resistance, current flowing through the drift regions flows from the first drain region 3a to the second drain region 31b, where the impurity concentration is high. When the current is low, the current flows through front surfaces of the first drain region 3a and the second drain region 3b. When the current is high, the current flows while extending depthwise from the front surfaces of the first drain region 3a and the second drain region 3b.

Additionally, in a planar view from the normal direction (for example, the Z axis direction) of the semiconductor substrate SB, the temperature detecting element TD is positioned between the drain electrode DE and the source electrode SE. A portion between the drain electrode DE and the source electrode SE overlaps with the current path. Thus, the temperature detecting element TD is positioned in the vicinity of the current path that is a heat generating portion, so that the temperature detecting element TD can early detect temperature rise. As a result, the semiconductor element 50 can further reduce the possibilities of malfunctions and breakdowns due to temperature rise.

In addition, the temperature detecting element TD is provided in the second region AR2. By doing this, the well region 31 positioned below the temperature detecting element TD is fixed at a source potential (for example, 0 V), so that application of an unintended bias to the temperature detecting element TD from the well region 31 can be prevented. This can prevent characteristics of the temperature detecting element TD from fluctuating due to the bias applied from the surrounding.

Additionally, the temperature detecting element TD includes the p-n junction diodes 40 each including the first conductivity type layer (for example, the n-type semiconductor layer 42) and the second conductivity type layer (for example, the p-type semiconductor layer 41) electrically connected to the n-type semiconductor layer 42. Thus, the temperature detecting element TD can be produced by a semiconductor process.

In addition, the semiconductor element 50 further includes the anode electrode pad A electrically connected to the anode side of the temperature detecting element TD and the cathode electrode pad K electrically connected to the cathode side of the temperature detecting element TD. The anode electrode pad A and the cathode electrode pad K are arranged at the outer peripheral portion of the semiconductor substrate SB. In this manner, the anode electrode pad A and the cathode electrode pad K can be arranged on the high breakdown voltage structure portion (for example, the LOCOS film 15) of the outer peripheral portion. This can increase breakdown voltage between the anode electrode pad A and the semiconductor substrate SB and between the cathode electrode pad K and the semiconductor substrate SB, respectively. Additionally, it is unnecessary to provide the high breakdown voltage structure portion arranged below the anode electrode pad A and the cathode electrode pad K, in the active region of the semiconductor substrate SB. Thus, reduction of the area of the active region can be prevented.

Furthermore, the semiconductor element 50 further includes the first gate electrode pad G1 electrically connected to the gate of the first MOS transistor Tr1 and the second gate electrode pad G2 electrically connected to the gate of the second MOS transistor Tr2. The first gate electrode pad G1 and the second gate electrode pad G2 are arranged at the outer peripheral portion of the semiconductor substrate SB. By doing this, the first gate electrode pad G1 and the second gate electrode pad G2 can be arranged on the LOCOS film 15 of the outer peripheral portion. This can increase breakdown voltage between the first gate electrode pad G1 and the semiconductor substrate SB and between the second gate electrode pad G2 and the semiconductor substrate SB, respectively. Additionally, it is unnecessary to provide the high breakdown voltage structure portion arranged below the first gate electrode pad G1 and the second gate electrode pad G2, in the active region of the semiconductor substrate SB. Thus, reduction of the area of the active region can be prevented.

In addition, the semiconductor element 50 further includes the current detecting electrode pad Cs configured to detect current flowing through the semi conductor substrate SB (for example, current flowing between the first MOS transistor Tr1 and the second MOS transistor Tr2). The current detecting electrode pad Cs is arranged at the outer peripheral portion of the semiconductor substrate SB. By doing this, the current detecting electrode pad Cs can be arranged on the LOCOS film 15 of the outer peripheral portion. This can increase breakdown voltage between the current detecting electrode pad Cs and the semiconductor substrate SB. Additionally, it is unnecessary to provide the high breakdown voltage structure portion arranged below the current detecting electrode pad Cs, in the active region of the semiconductor substrate SB. Thus, reduction of the area of the active region can be prevented.

Furthermore, the semiconductor element 50 further includes the potential detecting electrode pad Ss configured to detect potential of the semiconductor substrate SB (for example, potential of the source region 8b of the second MOS transistor Tr2). The potential detecting electrode pad Ss is arranged at the outer peripheral portion of the semiconductor substrate SB. By doing this, the potential detecting electrode pad Ss can be arranged on the LOCOS film 15 of the outer peripheral portion. This can increase breakdown voltage between the potential detecting electrode pad Ss and the semiconductor substrate SB. Additionally, it is unnecessary to provide the high breakdown voltage structure portion arranged below the potential detecting electrode pad Ss, in the active region of the semiconductor substrate SB. Thus, reduction of the area of the active region can be prevented.

Moreover, the semiconductor device 100 according to the embodiment of the present invention includes the above-described semiconductor element 50 and the control element 150 connected to the semiconductor element 50. The control element 150 turns on and off the first MOS transistor Tr1 and the second MOS transistor Tr2. For example, on the basis of a signal input from the semiconductor element 50, the control element 150 turns on and off the first MOS transistor Tr1 and the second MOS transistor Tr2. By doing this, the semiconductor device 100 can reduce the possibilities of malfunctions and breakdowns in the semiconductor element 50 and the control element 150.

Note that the same advantageous effect can be obtained even by replacing the semiconductor element 50 of the semiconductor device 100 with the semiconductor element 51.

Modifications

The above embodiment, has described the case where the temperature detecting element TD is arranged in the vicinity of the boundary portion AR3 in the second region AR2. However, the embodiment is not limited thereto.

Figure 24:
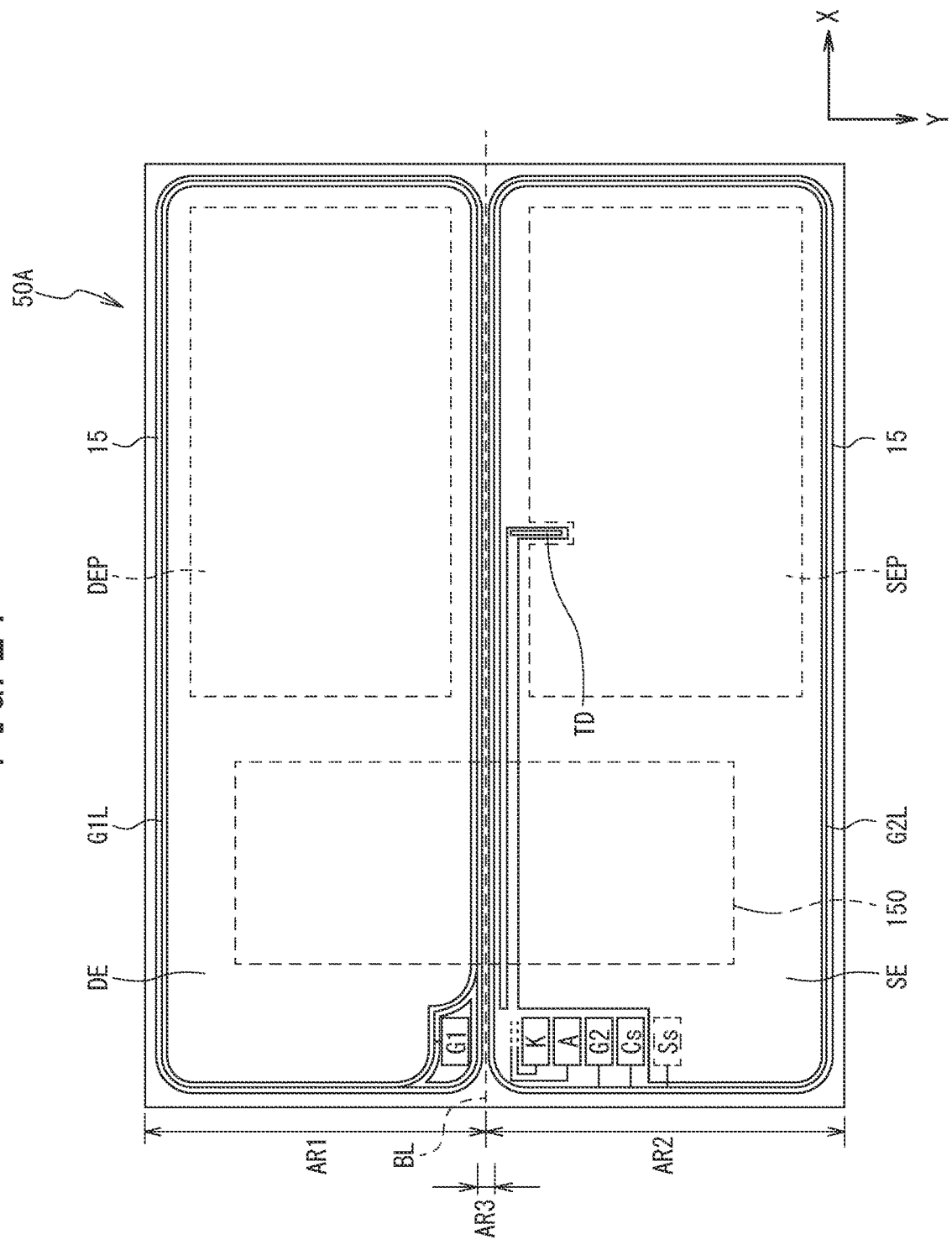
FIG. 24 is a plan view illustrating a structural example of a semiconductor element according to modification 1 of the embodiment of the present invention.

FIG. 24 is a plan view illustrating a structure of a semiconductor element according to modification 1 of the embodiment of the present invention. Note that FIG. 24 does not illustrate the protecting film 60 illustrated in FIG. 23. In FIG. 24, the first gate wire G1L and the second gate wire G2L, respectively, are indicated by lines. As illustrated in FIG. 24, in a semiconductor element 50A according to modification 1 of the embodiment, the temperature detecting element TD is arranged so as to enter the inside of the second region AR2 from the vicinity of the boundary portion AR3.

Even in such a structure, the temperature detecting element TD is positioned between the drain electrode DE and the source electrode SE where current flows. Thus, the temperature detecting element TD can detect temperature of the heat generating portion in the semiconductor element 50A.

Additionally, in the semiconductor element 50A, the temperature detecting element TD is arranged so as to enter an inside of the source electrode pad SEP. This enables the temperature detecting element TD to be positioned close to the joint portions between the source electrode pad SEP and the wire 126, so that the temperature detecting element TD can measure the temperature of the region that tend to have the highest temperature (the joint portions between the source electrode pad SEP and the wire 126). Additionally, arranging the temperature detecting element TD so as to enter the inside of the second region AR2 enables measurement of temperature near a center portion of the second region AR2. Note that the arrangement position of the temperature detecting element TD is not limited to the second region AR2 and the temperature detecting element TD may be arranged in the first region AR1.

Additionally, as illustrated in FIG. 2, the above embodiment has described the case where the first gate electrode pad G1 provided in the first region AR1 and the second gate electrode pad G2 provided in the second region AR2 are arranged side by side in the Y axis direction. However, the embodiment is not limited thereto.

Figure 25:
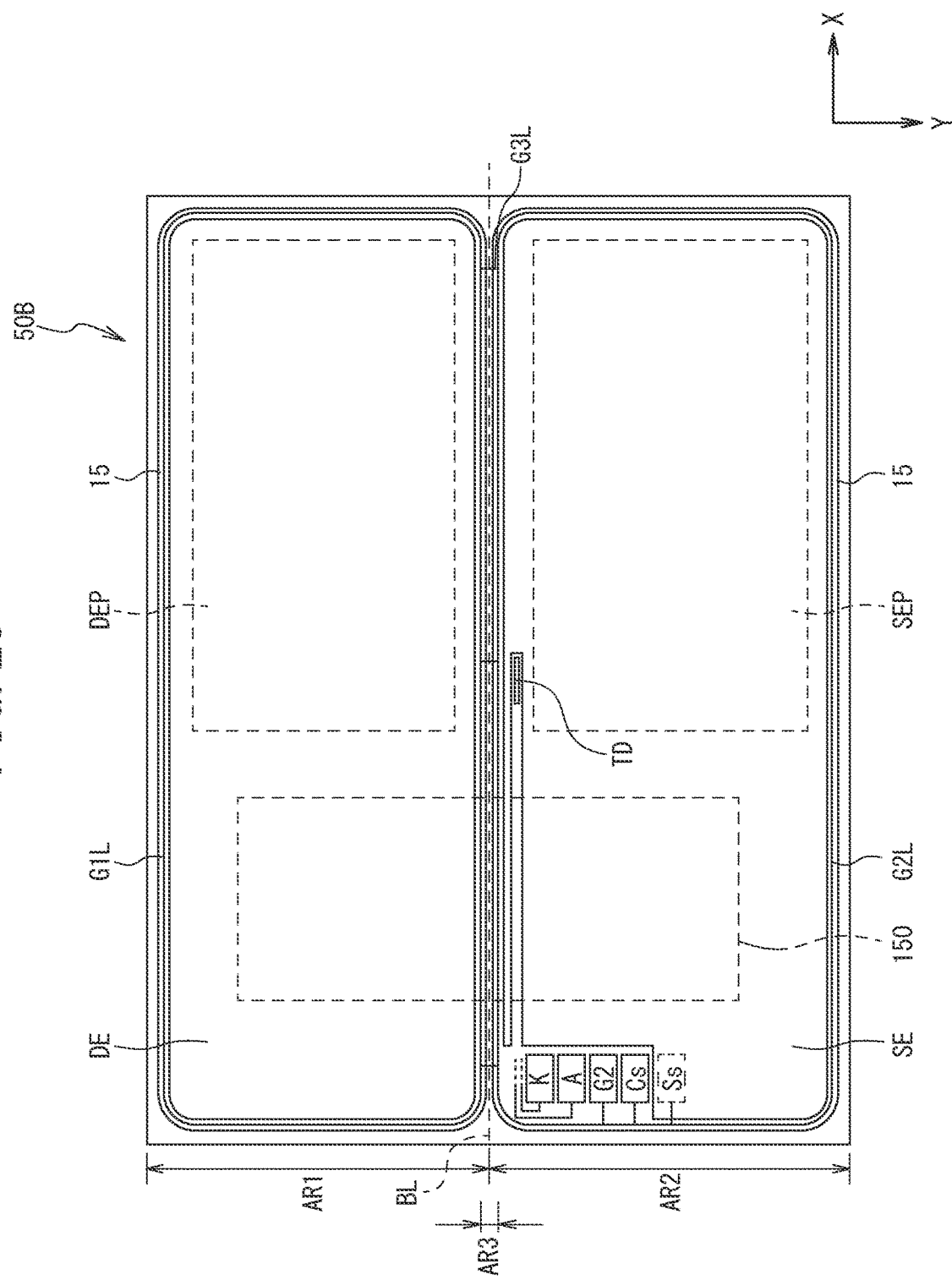
FIG. 25 is a plan view illustrating a structural example of a semiconductor element according to modification 2 of the embodiment of the present invention.

FIG. 25 is a plan view illustrating a structure of a semiconductor element according to modification 2 of the embodiment of the present invention. In FIG. 25, the first gate wire G1L, the second gate wire G2L, and a gate wire connecting portion G3L, respectively, are indicated by lines. As illustrated in FIG. 25, in a semiconductor element 50B according to modification 2 of the embodiment, the first gate wire G1L arranged on an outer periphery of the first MOS transistor Tr1 may be connected to the second gate wire G2L arranged on an outer periphery of the second MOS transistor Tr2. For example, a plurality of gate wire connecting portions G3L may be provided between the first gate wire G1L arranged on the outer periphery of the first MOS transistor Tr1 and the second gate wire G2L arranged on the outer periphery of the second MOS transistor Tr2 to connect the first and second gate wires G1L and G2L. This makes it unnecessary to form the first gate electrode pad G1 in the first MOS transistor Tr1, so that the area of the active region of the first MOS transistor Tr1 can be increased. Note that FIG. 25 does not illustrate the protecting film 60 illustrated in FIG. 23.

Figure 26:
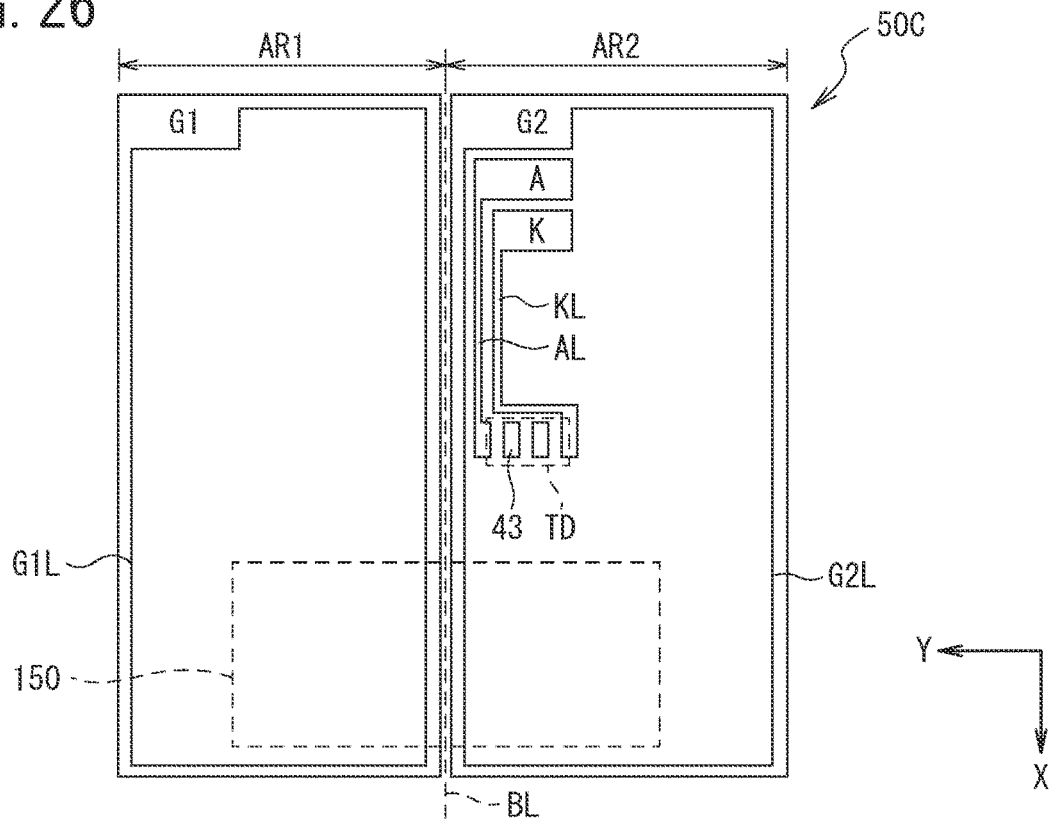
FIG. 26 is a plan view illustrating a structural example of a semiconductor element according to modification 3 of the embodiment of the present invention.
Figure 27:
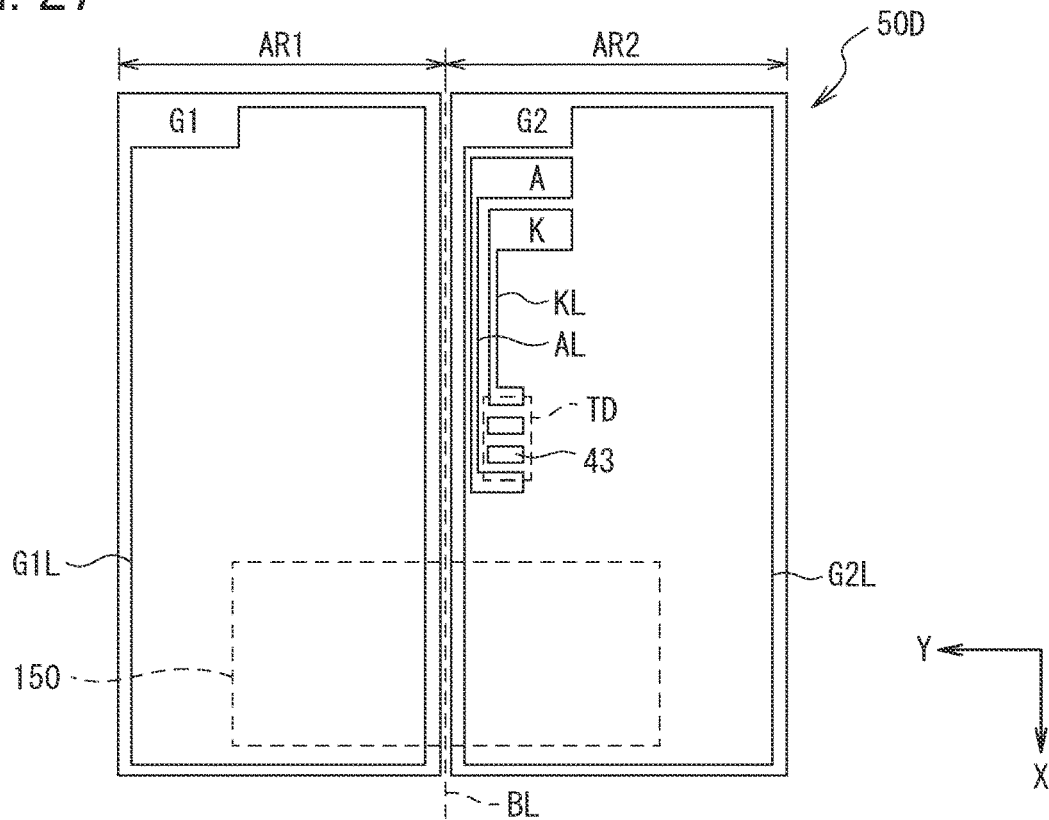
FIG. 27 is a plan view illustrating a structural example of a semiconductor element according to modification 4 of the embodiment of the present invention.

FIG. 26 is a plan view illustrating a structure of a semiconductor element according to modification 3 of the embodiment of the present invention. FIG. 27 is a plan view illustrating a structure of a semiconductor element according to modification 4 of the embodiment of the present invention. As illustrated in FIG. 26 and FIG. 27, in the semiconductor element 50C according to modification 3 of the embodiment and the semiconductor element 50D according to modification 4 of the embodiment, an arrangement direction of the first gate electrode pad G1 and the second gate electrode pad G2 intersects with an arrangement direction of the second gate electrode pad G2, the anode electrode pad A, and the cathode electrode pad K, in a planar view. For example, the first gate electrode pad G1 and the second gate electrode pad G2 are arranged side by side in the Y axis direction. The second gate electrode pad G2, the anode electrode pad A, and the cathode electrode pad K are arranged side by side in the X axis direction. Even in such a structure, the control element 150 can be stacked on each of the semiconductor elements 50C and 50D. It is also possible to connect each of the semiconductor elements 50C and 50D to the control element 150 by the wire 121 (see FIG. 20). Note that FIG. 26 and FIG. 27 do not illustrate the protecting film 60 illustrated in FIG. 23.

Note that, as illustrated in FIG. 26, the semiconductor element 50C exemplifies a case where the p-type semiconductor layers 41 (see FIG. 17), the n-type semiconductor layers 42 (see FIG. 17), and the relay electrode 43 forming the temperature detecting element TD are arranged side by side in the Y axis direction. As illustrated in FIG. 27, the semiconductor element 50D exemplifies a case where the p-type semiconductor layer 41, the n-type semiconductor layer 42, and the relay electrode 43 are arranged side by side in the X axis direction. In the present embodiment, no limitation is placed on the arrangement direction of the p-type semiconductor layer 41, the n-type semiconductor layer 42, and the relay electrode 43, and any optional direction parallel to an X-Y plane may be employed.

Figure 28:
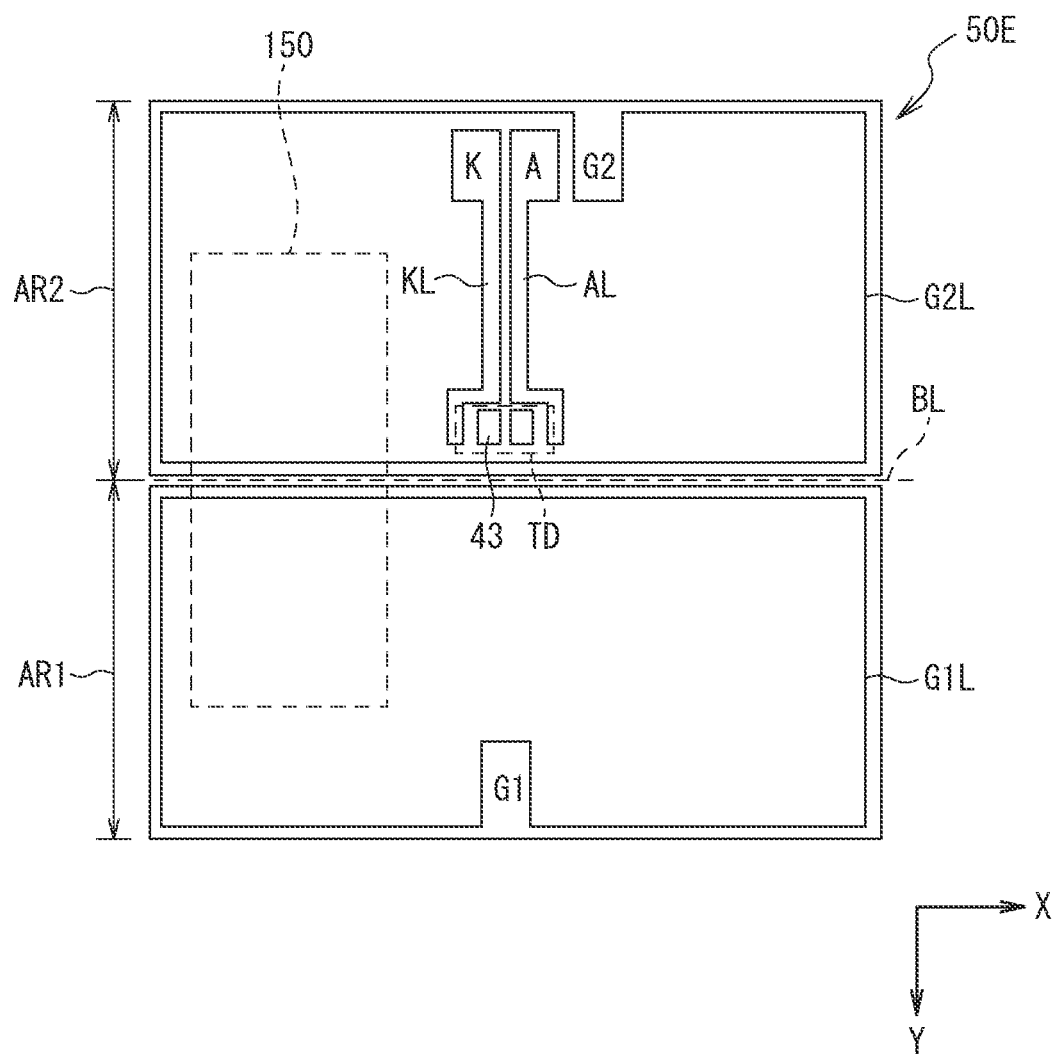
FIG. 28 is a plan view illustrating a structural example of a semiconductor element according to modification 5 of the embodiment of the present invention.

FIG. 28 is a plan view illustrating a structure of a semiconductor element according to modification 5 of the embodiment of the present invention. As illustrated in FIG. 28, in a semiconductor element 50E according to modification 5 of the embodiment, the anode electrode pad A and the cathode electrode pad K are arranged to face the temperature detecting element TD across the center portion of the second region AR2. For example, at the outer peripheral portion of the second region AR2, the temperature detecting element TD is arranged on a side close to the boundary BL, whereas the anode electrode pad A and the cathode electrode pad K are arranged on a side distant from the boundary BL. Additionally, the anode wire AL electrically connecting the anode electrode pad A and the temperature detecting element TD and the cathode wire KL electrically connecting the cathode electrode pad K and the temperature detecting element TD are extendingly provided so as to traverse the second region AR2 in the Y axis direction. Even in such a structure, the control element 150 can be stacked on the semiconductor element 50E. It is also possible to connect the semiconductor element 50E and the control element 150 by the wire 121 (see FIG. 20). Note that FIG. 28 does not illustrate the protecting film 60 illustrated in FIG. 23.

Figure 29:
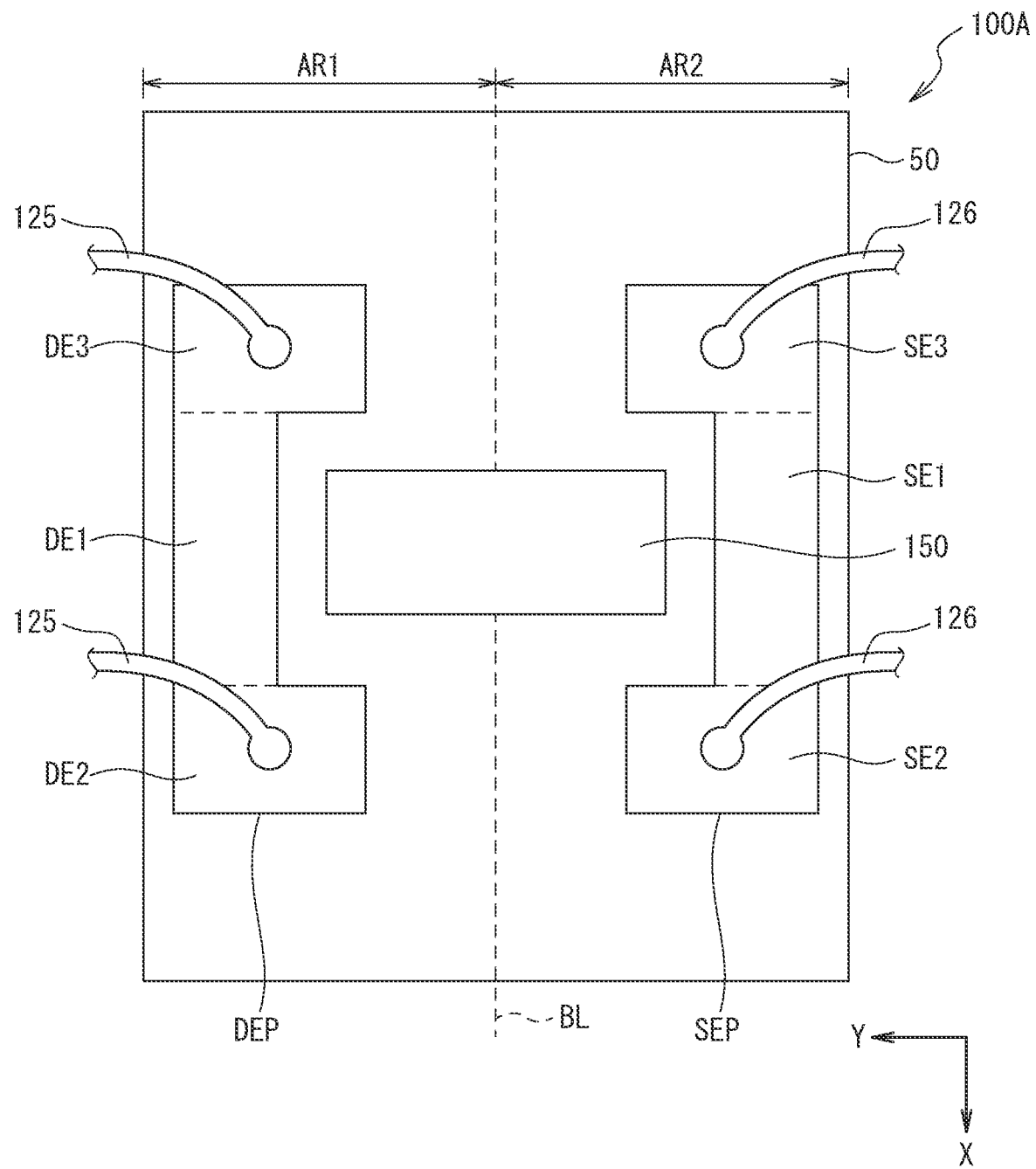
FIG. 29 is a plan view illustrating a structural example of a semiconductor device according to a modification of the embodiment of the present invention.

FIG. 29 is a plan view illustrating a structure of a semiconductor device according to modification 6 of the embodiment of the present invention. As illustrated in FIG. 29, in a semiconductor device 100A according to modification 6 of the embodiment, the control element 150 is arranged between the drain electrode pad DEP and the source electrode pad SEP in a planar view. The drain electrode pad DEP and the source electrode pad SEP are line symmetrical to each other. The drain electrode pad DEP and the source electrode pad SEP have the same or substantially the same area in a planar view. Note that FIG. 29 does not illustrate the protecting film 60 illustrated in FIG. 23.

In modification 6 of the embodiment, the drain electrode pad DEP includes a first portion DE1, a second portion DE2 positioned at one end of the first portion DE1, and a third portion DE3 positioned at another end of the first portion DE1. The source electrode pad SEP includes a first portion SE1, a second portion SE2 positioned at one end of the first portion SE1, and a third portion SE3 positioned at another end of the first portion SE1. A separation distance between the drain electrode pad DEP and the source electrode pad SEP is the shortest between the second portions DE2 and SE2 and between the third portions DE3 and SE3, respectively, and is the longest between the first portions DE1 and SE1. The control element 150 is arranged between the first portions DE1 and SE1, where the above separation distance is the longest in a planar view.

In such a structure, current flows between the second portions DE2 and SE2 and between the third portions DE3 and SE3, where the separation distance is the shortest. Current hardly flows between the first portions DE1 and SE1 where the separation distance is the longest. Due to this, the semiconductor element 50 has a heat generation portion between the second portions DE2 and SE2 and between the third portions DE3 and SE3, respectively. Since the control element 150 is located at a position away from the heat generation portions, temperature rise is suppressed.

Additionally, in modification 6 of the embodiment, the wire 125 is connected to each of the second portion DE2 and the third portion DE3, and the wire 126 is connected to each of the second portion SE2 and the third portion SE3. The control element 150 is positioned away from joint portions between the drain electrode pad DEP and the wire 125 and joint portions between the source electrode pad SEP and the wire 126, where temperature tends to become the highest, so that temperature rise is suppressed.

Note that, in modification 1 and modification 6, the direction of extension of the gate electrode 6 may be parallel to the X axis direction, as in the semiconductor element 50, or may be parallel to the Y axis direction, as in the semiconductor element 51.

Other Embodiments

While the present invention has been described by the embodiment and the modifications, it should be understood that the descriptions and drawings constituting parts of this disclosure are not intended to limit the present invention. After reading this disclosure, it will become clear to those skilled in the art how to implement the invention in various alternative embodiments and alternative modifications.

For example, the above embodiment has described the case where the semiconductor substrate SB includes the support substrate 1 and the semiconductor layer 2 formed on the front surface 1a of the support substrate 1, in which the support substrate 1 is the single crystal Si substrate and the semiconductor layer 2 is the single crystal Si layer. However, in the embodiment of the present invention, the structure of the semiconductor substrate SB is not limited thereto. The semiconductor substrate SB may be formed only by a single crystal Si substrate. Alternatively, the semiconductor substrate SB may be formed only by a single crystal Si layer.

In addition, the gate insulating film 5 is not limited to the $SiO_2$ film, and may be an insulating film other than that. Usable examples of the gate insulating film 5 include a silicon oxynitride (SiON) film, a strontium oxide (SrO) film, a silicon nitride ($Si_3N_4$) film, and an aluminum oxide ($Al_2O_3$) film. Additionally, a composite film formed by laminating a plurality of single-layer insulating films, or the like is usable as the gate insulating film 5. MOS transistors formed by using an insulating film other than an $SiO_2$ film as the gate insulating film 5 may be referred to as metal insulator semiconductor (MIS) transistors. The term "MIS transistors" means more comprehensive insulated gate transistors, including MOS transistors.

For example, the above present embodiment has described the case where the first gate electrode pad G1 is provided in the first region AR1, and the second gate electrode pad G2, the cathode electrode pad K, the anode electrode pad A, the current detecting electrode pad Cs, and the potential detecting electrode pad Ss are provided in the second region AR2. It has also been described that the first gate electrode pad G1, the second gate electrode pad G2, the cathode electrode pad K, the anode electrode pad A, the current detecting electrode pad Cs, and the potential detecting electrode pad Ss are arranged side by side in the Y axis direction. However, the cathode electrode pad K, the anode electrode pad A, and the current detecting electrode pad Cs other than the potential detecting electrode pad Ss may be provided in the first region AR1. Furthermore, the temperature detecting element TD and the third MOS transistor Tr1 serving as the current detecting element also may be arranged in the first region AR1. Alternatively, the cathode electrode pad K, the anode electrode pad A, and the current detecting electrode pad Cs may be provided in both the first region AR1 and the second region AR2.

In addition, while the present embodiment has employed the trench-gate structure including the gate electrode, a planar-gate structure may be employed instead.

REFERENCE SIGNS LIST

1: Support substrate
1a, 2a, 50a: Front Surface
1b: Back surface
2: Semiconductor layer
2TA, 2TB: Trench
3a: First drain region
3b: Second drain region
5: Gate insulating film
5A, 14: Insulating film
6: Gate electrode
6A: Field plate
6B: Semiconductor film
7: $p^+$ region
8: Source region
8a: First source region
8b: Second source region
9: Interlayer insulating film
11: Back surface electrode
12: Barrier metal
13: Plug electrode
15: LOCUS film
21: First semiconductor region
22: Second semiconductor region
31: Well region
32: Resurf region
33: Channel stopper region
40: p-n junction diode
41: p-type semiconductor layer
42: n-type semiconductor layer
43: Relay electrode
50, 50A, 50B, 50C, 50D, 50E: Semiconductor element
51: Semiconductor element
60: Protecting film
61: Adhesive agent
100, 100A: Semiconductor device
110: Lead frame
111: island
112, 113, 114, 115, 116: Lead terminal
121, 122, 123, 124, 125, 126: Wire
130: Resin package
150: Control element
151: Substrate
151a: Upper surface
152: Protecting film
161, 161A, 161B, 161C, 161D, 161E, 161F, 162, 163, 164, 165: Electrode pad
A: Anode electrode pad
AL: Anode wire
AR1: First region
AR2: Second region
AR3: Boundary portion
AR11, AR21: Region
BD1: First body diode
BD2: Second body diode
BD3: Third body diode
BL: Boundary
BT: Power source unit
CrE: Corner electrode
Cs: Current detecting electrode pad
DE: Drain electrode
DEP: Drain electrode pad
DE1, SE1: First portion
DE2, SE2: Second portion
DE3, SE3: Third portion
G1: First gate electrode pad
G1L: First gate wire
G2: Second gate electrode pad
G2L: Second gate wire
G3L: Gate wire connecting portion
H91, H92: Through hole
K: cathode electrode pad
KL: cathode wire
LCT: Load
SB: Semiconductor substrate
SE: Source electrode
SEP: Source electrode pad
Ss: Potential detecting electrode pad
TD: Temperature detecting element
Tr1: First MOS transistor
Tr2: Second MOS transistor
Tr3: Third MOS transistor

The invention claimed is:

1. A semiconductor element comprising:
a semiconductor substrate including a first region and a second region adjacent to each other;
a first transistor provided in the first region;
a second transistor provided in the second region;
a drain electrode provided in the first region;
a source electrode provided in the second region and arranged away from the drain electrode; and
a temperature detecting element provided on the semiconductor substrate, wherein,
the first transistor includes a first source region of a first conductivity type, a first semiconductor region of the first conductivity type arranged away from the first source region, and a first well region of a second conductivity type arranged between the first source region and the first semiconductor region,
the second transistor includes a second source region of the first conductivity type, a second semiconductor region of the first conductivity type arranged away from the second source region, and a second well region of the second conductivity type arranged between the second source region and the second semiconductor region,
the first semiconductor region is connected to the second semiconductor region, and the drain electrode is electrically connected to the first source region, and the source electrode is electrically connected to the second source region.

2. The semiconductor element according to claim 1, wherein the first semiconductor region is integrated with the second semiconductor region.

3. The semiconductor element according to claim 1, wherein, in a planar view from a normal direction of the semiconductor substrate, the temperature detecting element is positioned between the drain electrode and the source electrode.

4. The semiconductor element according to claim 1, wherein the temperature detecting element is provided in the second region.

5. The semiconductor element according to claim 1, wherein the temperature detecting element includes at least one diode including a first conductivity type layer and a second conductivity type layer connected to the first conductivity type layer.

6. The semiconductor element according to claim 1, further comprising an anode electrode pad electrically connected to an anode side of the temperature detecting element and a cathode electrode pad electrically connected to a cathode side of the temperature detecting element, wherein the anode electrode pad and the cathode electrode pad are arranged at an outer peripheral portion of the semiconductor substrate.

7. The semiconductor element according to claim 1, wherein the first transistor includes a first trench penetrating through the first well region from a front surface of the first semiconductor region and adjoining the first source region, a gate insulating film arranged in the first trench, and a first gate electrode embedded in the first trench via the gate insulating film, and the second transistor includes a second trench penetrating through the second well region from a front surface of the second semiconductor region and adjoining the second source region, the gate insulating film arranged in the second trench, and a second gate electrode embedded in the second trench via the gate insulating film.

8. The semiconductor element according to claim 7, further comprising a first gate electrode pad electrically connected to the first gate electrode of the first transistor and a second gate electrode pad electrically connected to the second gate electrode of the second transistor, wherein the first gate electrode pad and the second gate electrode pad are arranged at the outer peripheral portion of the semiconductor substrate.

9. The semiconductor element according to claim 8, wherein on an outer periphery of the first transistor is provided a first gate wire electrically connected to the first gate electrode and electrically connected to the first gate electrode pad, and on an outer periphery of the second transistor is provided a second gate wire electrically connected to the second gate electrode and electrically connected to the second gate electrode pad.

10. The semiconductor element according to claim 8, wherein on an outer periphery of the first transistor is provided a first gate wire electrically connected to the first gate electrode, on an outer periphery of the second transistor is provided a second gate wire electrically connected to the second gate electrode and electrically connected to the second gate electrode pad, and the first gate wire is electrically connected to the second gate wire.

11. The semiconductor element according to claim 7, including a channel stopper region of the second conductivity type at a boundary between the first region and the second region, and including a first resurf region of the second conductivity type arranged between the channel stopper region and the first well region and a second resurf region of the second conductivity type arranged between the channel stopper region and the second well region, wherein the first well region is shallower than the first trench, and the first resurf region is deeper than the first trench, and wherein the second well region is shallower than the second trench, and the second resurf region is deeper than the second trench.

12. The semiconductor element according to claim 11, wherein the first resurf region is arranged on the outer periphery of the first transistor, and the second resurf region is arranged on the outer periphery of the second transistor.

13. The semiconductor element according to claim 1, further comprising a current detecting electrode pad configured to detect current flowing through the semiconductor substrate, wherein the current detecting electrode pad is arranged at the outer peripheral portion of the semiconductor substrate.

14. The semiconductor element according to claim 1, further comprising a potential detecting electrode pad configured to detect potential of the semiconductor substrate, wherein the potential detecting electrode pad is arranged at the outer peripheral portion of the semiconductor substrate.

15. The semiconductor element according to claim 1, wherein the semiconductor substrate includes, on a first semiconductor layer of the first conductivity type, a second semiconductor layer of the first conductivity type having a lower impurity concentration than the impurity concentration of the first semiconductor layer.

16. The semiconductor element according to claim 15, wherein the second semiconductor layer includes the first semiconductor region and the second semiconductor region.

17. The semiconductor element according to claim 16, including a first drain region of the first semiconductor layer positioned in the first region and a second drain region of the first semiconductor layer positioned in the second region, wherein the first drain region is connected to the second drain region.

18. A semiconductor device comprising:
the semiconductor element according to claim 1; and
a control element connected to the semiconductor element, the control element turning on and off the first transistor and the second transistor.

* * * * *